(12) United States Patent
Yashiki et al.

(10) Patent No.: US 9,590,508 B2
(45) Date of Patent: Mar. 7, 2017

(54) CONTROL APPARATUS, AND CONTROL METHOD FOR BUCK-BOOST POWER SUPPLY WITH TWO PRIMARY SWITCHES

(71) Applicant: Spansion LLC, Sunnyvale, CA (US)

(72) Inventors: Makoto Yashiki, Aichi (JP); Toru Miyamae, Aichi (JP)

(73) Assignee: Cypress Semiconductor Corporation, San Jose, CA (US)

(*) Notice: Subject to any disclaimer, the term of this patent is extended or adjusted under 35 U.S.C. 154(b) by 129 days.

(21) Appl. No.: 14/447,688

(22) Filed: Jul. 31, 2014

(65) Prior Publication Data

US 2016/0036332 A1 Feb. 4, 2016

(51) Int. Cl.
 *H02M 3/158* (2006.01)
 *H02M 1/08* (2006.01)
 (Continued)

(52) U.S. Cl.
 CPC .......... *H02M 3/1582* (2013.01); *H02M 1/08* (2013.01); *H03K 17/063* (2013.01); *H02M 2001/0003* (2013.01); *H03K 2217/0081* (2013.01)

(58) Field of Classification Search
 CPC .. H02M 3/158; H02M 3/1582; H02M 3/1588; H03K 17/28; H03K 17/284
 (Continued)

(56) References Cited

U.S. PATENT DOCUMENTS 8,179,113 B2 * 5/2012 Singnurkar ......... H02M 3/1582
 323/282

9,219,372 B2 * 12/2015 Paparrizos .......... H02M 3/1582
 (Continued)

FOREIGN PATENT DOCUMENTS

JP 0727960 A * 2/2007
JP 2010-158144 7/2010

*Primary Examiner* — Jeffrey Gblende
*Assistant Examiner* — Jye-June Lee

(57) ABSTRACT

A control apparatus, a buck-boost power supply, and a control method that can control an output part comprising two primary switches which are N-type transistors without changing the switching frequency are provided. A control apparatus for a buck-boost power supply comprises: a pulse-width modulation (PWM) signal generator configured to generate a PWM signal having a pulse whose pulse width is based on an output voltage; a mode pulse signal generator configured to generate a mode pulse signal having a signal whose time period is based on at least one of an input voltage, a difference between an input voltage and the output voltage, and a difference between an input voltage and a voltage proportional to the output voltage; a first delayed signal generator configured to generate a first delayed signal having a pulse whose rising edge or falling edge is delayed for a first delay time from a rising edge or a falling edge of the pulse of the PWM signal; and an output controller configured to control an output part of the buck-boost power supply, based on the PWM signal, the mode pulse signal, and the first delayed signal, the output part comprising: two primary switches that are each an N-type transistor; a boost capacitor for driving the high-side switch of the primary switches; and two secondary switches that are each a transistor, wherein the output controller controls switching of the output part so that a first time period during which the high-side switch of the primary switches is off and the low-side switch of the primary switches is on is longer than or equal to the first delay time.

15 Claims, 31 Drawing Sheets

(51) Int. Cl.
*H03K 17/06* (2006.01)
*H02M 1/00* (2006.01)

(58) Field of Classification Search
USPC .............. 323/271, 901; 363/123, 16, 17, 49; 327/392, 398
See application file for complete search history.

(56) References Cited

U.S. PATENT DOCUMENTS

2006/0055384 A1* 3/2006 Jordan .................. H02M 3/158
323/282
2007/0182390 A1* 8/2007 Ishii ..................... H03K 17/163
323/282
2009/0251122 A1* 10/2009 Singnurkar ......... H02M 3/1582
323/311

* cited by examiner

CONTROL APPARATUS, AND CONTROL METHOD FOR BUCK-BOOST POWER SUPPLY WITH TWO PRIMARY SWITCHES

BACKGROUND

DC-to-DC converters, such as buck-boost converters, with high power conversion efficiency are widely used as one of the typical switching power supplies. A known control apparatus for a buck-boost converter is an output voltage control circuit capable of switching between a step-up mode and a step-down mode without a step-up/step-down mode, as disclosed in JP2010-158144 A.

In the case where two primary switches supplied with an input voltage in the buck-boost converter are both N-type transistors, a high-side switch of the primary switches is not driven unless a voltage greater than or equal to the input voltage is applied to the high-side switch. Accordingly, a capacitor for driving the high-side switch may be provided to supply the charge stored in the capacitor to drive the high-side switch.

In such a case, the charge in the capacitor decreases when the high-side switch is turned on. To turn on the high-side switch again, the capacitor needs to be charged while the high-side switch is off.

One possible method is as follows: a control signal for switching the buck-boost converter is forcibly turned off to provide a time period for charging the capacitor. Such a method, however, changes the switching frequency of the buck-boost converter. This can lead to problems such as increased gate charge loss of the transistors, decreased power conversion efficiency of the buck-boost converter, and noise.

SUMMARY

Embodiments have an object of providing a control apparatus, a buck-boost power supply, and a control method that can control an output part comprising two primary switches which are N-type transistors without changing the switching frequency.

According to an embodiment, a control apparatus for a buck-boost power supply comprises: a PWM signal generator configured to generate a PWM signal having a pulse whose pulse width is based on an output voltage; a mode pulse signal generator configured to generate a mode pulse signal having a signal whose time period is based on at least one of an input voltage, a difference between an input voltage and the output voltage, or a difference between an input voltage and a voltage proportional to the output voltage; a first delayed signal generator configured to generate a first delayed signal having a pulse whose rising edge or falling edge is delayed for a first delay time from a rising edge or a falling edge of the pulse of the PWM signal; and an output controller configured to control an output part of the buck-boost power supply, based on the PWM signal, the mode pulse signal and the first delayed signal, the output part comprising: two primary switches that are each an N-type transistor; a first capacitor for driving a high-side switch of the primary switches; and two secondary switches that are each a transistor, wherein the output controller controls switching of the output part so that a first time period during which the high-side switch of the primary switches is off and a low-side switch of the primary switches is on is longer than or equal to the first delay time.

A buck-boost power supply according to one embodiment comprises: an output part comprising: two primary switches that are each an N-type transistor; a first capacitor for driving a high-side switch of the primary switches; and two secondary switches that are each a transistor; and the control apparatus.

According to an embodiment, a control method for a buck-boost power supply comprises: generating a PWM signal having a pulse whose pulse width is based on an output voltage; generating a mode pulse signal having a signal whose time period is based on at least one of an input voltage, a difference between an input voltage and the output voltage, or a difference between an input voltage and a voltage proportional to the output voltage; generating a first delayed signal having a pulse whose rising edge or falling edge is delayed for a first delay time from a rising edge or a falling edge of the pulse of the PWM signal; and controlling an output part of the buck-boost power supply, based on the PWM signal, the mode pulse signal and the first delayed signal, the output part comprising: two primary switches that are N-type transistors; a first capacitor for driving a high-side switch of the primary switches; and two secondary switches that are each a transistor, wherein the controlling comprises controlling switching of the output part so that a first time period during which the high-side switch of the primary switches is off and a low-side switch of the primary switches is on is longer than or equal to the first delay time.

In the embodiments presented herein, the term "part", "means", "apparatus", or "system" does not merely denote physical means, but covers the case where the functions of the "part", "means", "apparatus", or "system" are realized by software. The functions of one "part", "means", "apparatus", or "system" may be realized by two or more physical means or apparatuses, and the functions of two or more "parts", "means", "apparatuses", or "systems" may be realized by one physical means or apparatus.

BRIEF DESCRIPTION OF THE DRAWINGS

The accompanying drawings are incorporated herein and form a part of the specification.

DETAILED DESCRIPTION

First Embodiment

Figure 1:
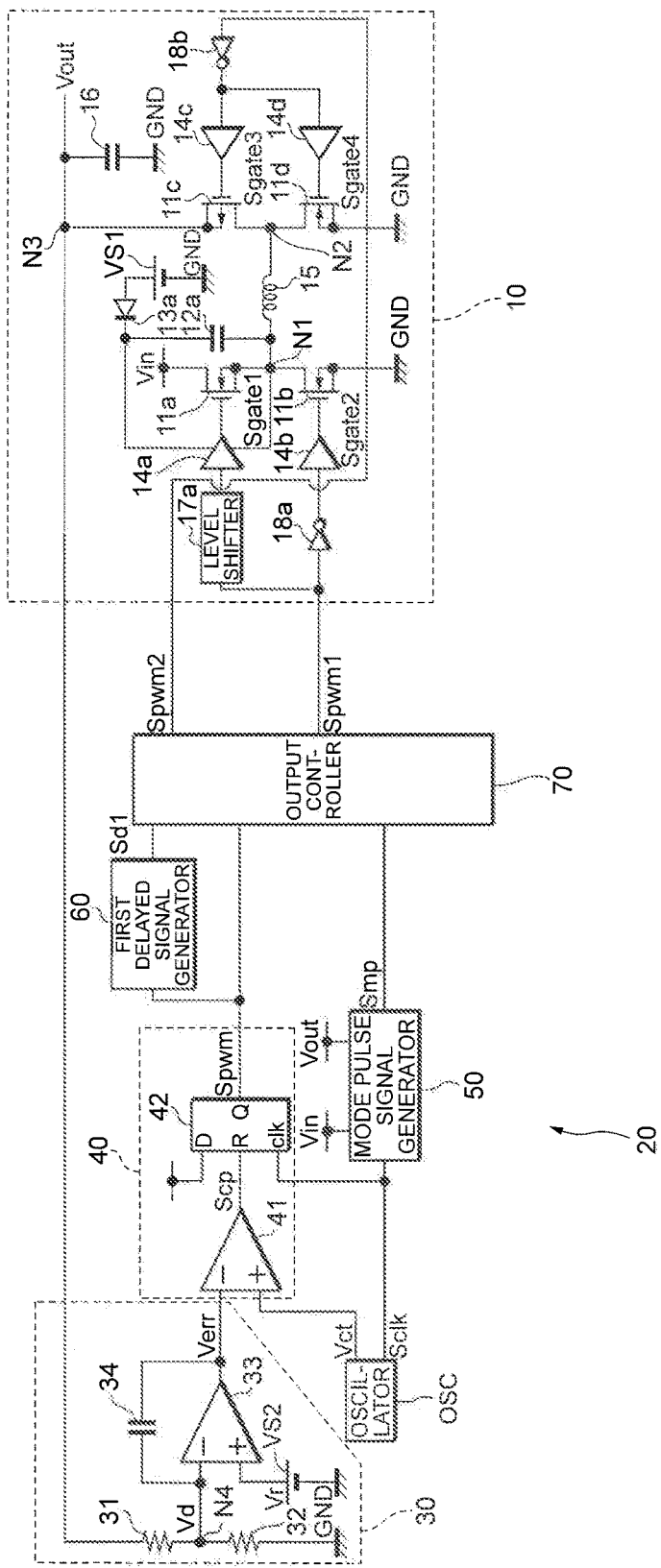
FIG. 1 is a circuit diagram showing an example of a buck-boost power supply, according to a first embodiment.

FIGS. 1 to 24 are diagrams describing a first embodiment. FIG. 1 is a circuit diagram showing an example of a buck-boost power supply 100 in the first embodiment. For example, the buck-boost power supply 100 is an H-bridge DC-to-DC converter that steps up or steps down an input voltage Vin to generate an output voltage Vout. The buck-boost power supply 100 comprises an output part 10 and a control apparatus 20, as shown in FIG. 1.

The output part 10 comprises switches 11a to 11d, a boost capacitor 12a, a boost diode 13a, buffer circuits 14a to 14d, an inductor 15, a smoothing capacitor 16, a level shifter 17a, and inverter circuits 18a and 18b.

The switches 11a and 11b are located at a first end of the inductor 15, and are primary switches supplied with the input voltage Vin. The switches 11c and 11d are located at a second end of the inductor 15, and are secondary switches for supplying the output voltage Vout to an external device connected to the buck-boost power supply 100.

The switch 11a is a high-side switch of the primary switches, and the switch 11b is a low-side switch of the primary switches. For example, the switches 11a and 11b are N-channel metal-oxide semiconductor field effect transistors (hereinafter referred to as "MOSFET"). The switch 11a has a drain supplied with the input voltage Vin, and a source connected to a node N1. The switch 11b has a drain connected to the node N1, and a source connected to a ground GND.

The switch 11c is a high-side switch of the secondary switches, and the switch 11d is a low-side switch of the secondary switches. For example, the switch 11c is a P-channel MOSFET, and the switch 11d is an N-channel MOSFET. The switch 11c has a source connected to a node N3, and a drain connected to a node N2. The switch 11d has a drain connected to the node N2, and a source connected to the ground GND.

The inductor 15 has one end connected to the node N1, and the other end connected to the node N2. The smoothing capacitor 16 has one end connected to the node N3, and the other end connected to the ground GND.

A drive signal Sgate1 is input to the gate of the switch 11a. The drive signal Sgate1 is a signal obtained by increasing the voltage level of a first control signal Spwm1 from the control apparatus 20 by the level shifter 17a and output from the buffer circuit 14a. The switch 11a is turned on or off in response to the drive signal Sgate1. For example, the switch 11a is on when the charge in the boost capacitor 12a mentioned above is supplied and the voltage level of the drive signal Sgate1 is relatively high (hereinafter referred to as "H level"), and off when the voltage level of the drive signal Sgate1 is relatively low (hereinafter referred to as "L level").

A drive signal Sgate2 is input to the gate of the switch 11b. The drive signal Sgate2 is a signal obtained by inverting the first control signal Spwm1 from the control apparatus 20 by the inverter circuit 18a and output from the buffer circuit 14b. The switch 11b is turned on or off in response to the drive signal Sgate2. For example, the switch 11b is on when the drive signal Sgate2 is at H level, and off when the drive signal Sgate2 is at L level.

A drive signal Sgate3 is input to the gate of the switch 11c. The drive signal Sgate3 is a signal obtained by inverting a second control signal Spwm2 from the control apparatus 20 by the inverter circuit 18b and output from the buffer circuit 14c. The switch 11c is turned on or off in response to the drive signal Sgate3. For example, the switch 11c is off when the drive signal Sgate3 is at H level, and on when the drive signal Sgate3 is at L level.

A drive signal Sgate4 is input to the gate of the switch 11d. The drive signal Sgate4 is a signal obtained by inverting the second control signal Spwm2 from the control apparatus 20 by the inverter circuit 18b and output from the buffer circuit 14d. The switch 11d is turned on or off in response to the drive signal Sgate4. For example, the switch 11d is on when the drive signal Sgate4 is at H level, and off when the drive signal Sgate4 is at L level.

The switches 11a to 11d are each a transistor, as mentioned above. Hence, the output part 10 can realize a synchronous rectification system when the drive signals Sgate1 to Sgate4 are respectively input to the switches 11a to 11d synchronously.

The control apparatus 20 is for controlling the buck-boost power supply 100. The control apparatus 20 comprises an error amplifier 30, a pulse-width modulation (hereinafter referred to as "PWM") signal generator 40, a mode pulse signal generator 50, a first delayed signal generator 60, and an output controller 70.

The error amplifier 30 comprises, for example, resistors 31 and 32, an amplifier 33, and a capacitor 34.

The resistor 31 has one end supplied with the output voltage Vout of the output part 10, and the other end connected to a node N4. The resistor 32 has one end connected to the node N4, and the other end connected to the ground GND.

The amplifier 33 has an inverting input terminal connected to the node N4, and a non-inverting input terminal supplied with a reference voltage Vr from a voltage source VS2. The capacitor 34 is connected between the inverting input terminal and output terminal of the amplifier 33. The capacitor 34 is an example of a phase compensation circuit.

The resistors 31 and 32 generate a voltage Vd by dividing the output voltage Vout at a voltage division ratio corresponding to their resistances. The voltage Vd is a voltage proportional to the output voltage Vout. The reference voltage Vr of the voltage source VS2 is, for example, a voltage obtained by dividing a target voltage, which is desired for stabilizing the output voltage Vout, at the voltage division ratio of the resistors 31 and 32. The reference voltage Vr is therefore a voltage proportional to the output voltage Vout. The amplifier 33 amplifies the difference between the voltage Vd and the reference voltage Vr, and outputs an error voltage Verr. The error voltage Verr is a voltage according to the output voltage Vout of the output part 10.

The PWM signal generator 40 is for generating a PWM signal Spwm. The PWM signal Spwm is a signal having a pulse whose pulse width is based on the output voltage Vout. The pulse width of the PWM signal Spwm increases as the output voltage Vout increases, up to a predetermined width as its upper limit. Hence, the PWM signal Spwm includes a signal of L level. The PWM signal generator 40 comprises, for example, a comparator 41 and a flip flop circuit 42.

The comparator 41 has an inverting input terminal supplied with the error voltage Verr of the error amplifier 30. An oscillator OSC outputs a triangle wave Vct, e.g. a sawtooth wave, of a predetermined period such as a period T. The comparator 41 has a non-inverting input terminal supplied with the triangle wave Vct of the oscillator OSC.

The comparator 41 compares the triangle wave Vct and the error voltage Verr, and outputs a signal Scp corresponding to the comparison result. For example, the comparator 41 outputs the signal Scp of H level in the case where the voltage of the triangle wave Vct is higher than the error voltage Verr, and outputs the signal Scp of L level in the case where the voltage of the triangle wave Vct is not higher than the error voltage Verr. The signal Scp accordingly has the same period as the period T of the triangle wave Vct. When the output voltage Vout of the output part 10 increases, the error voltage Verr decreases, so that the signal Scp is H level in a longer time period and L level in a shorter time period. When the output voltage Vout of the output part 10 decreases, the error voltage Verr increases, so that the signal Scp is H level in a shorter time period and L level in a longer time period. Thus, the signal Scp changes in duty ratio according to the output voltage Vout, in the period T.

Although this embodiment describes a voltage mode control system in which only the output voltage Vout is fed back to the control apparatus 20 as an example of the buck-boost power supply 100, this is not a limitation. For example, a current mode control system may be used. In the current mode control system, the current signal of the output part 10 is fed back to the control apparatus 20, and input to the non-inverting input terminal of the comparator 41 instead of the triangle wave Vct of the oscillator OSC.

The flip flop circuit 42 is, for example, a D-type flip flop circuit. The flip flop circuit 42 has a reset terminal to which the signal Scp of the comparator 41 is input, a clock input terminal to which a clock signal Sclk of the period T is input from the oscillator OSC, and a data input terminal, which is pulled up to a high voltage level for example.

The flip flop circuit 42 changes the level of the PWM signal Spwm output from its output terminal Q, based on the signal Scp and the clock signal Sclk. For example, the flip flop circuit 42 makes the PWM signal Spwm rise to H level in response to L level of the clock signal Sclk, and makes the PWM signal Spwm fall to L level in response to H level of the signal Scp. Thus, the flip flop circuit 42 outputs the PWM signal Spwm of H level, during the time period from the falling edge of the clock signal Sclk to the rising edge of the signal Scp. The flip flop circuit 42 also outputs the PWM signal Spwm of L level, during the time period from the rising edge of the signal Scp to the falling edge of the clock signal Sclk. The PWM signal Spwm completes one cycle between the falling edges of the clock signal Sclk, and so has the same period as the period T of the clock signal Sclk.

Figure 2:
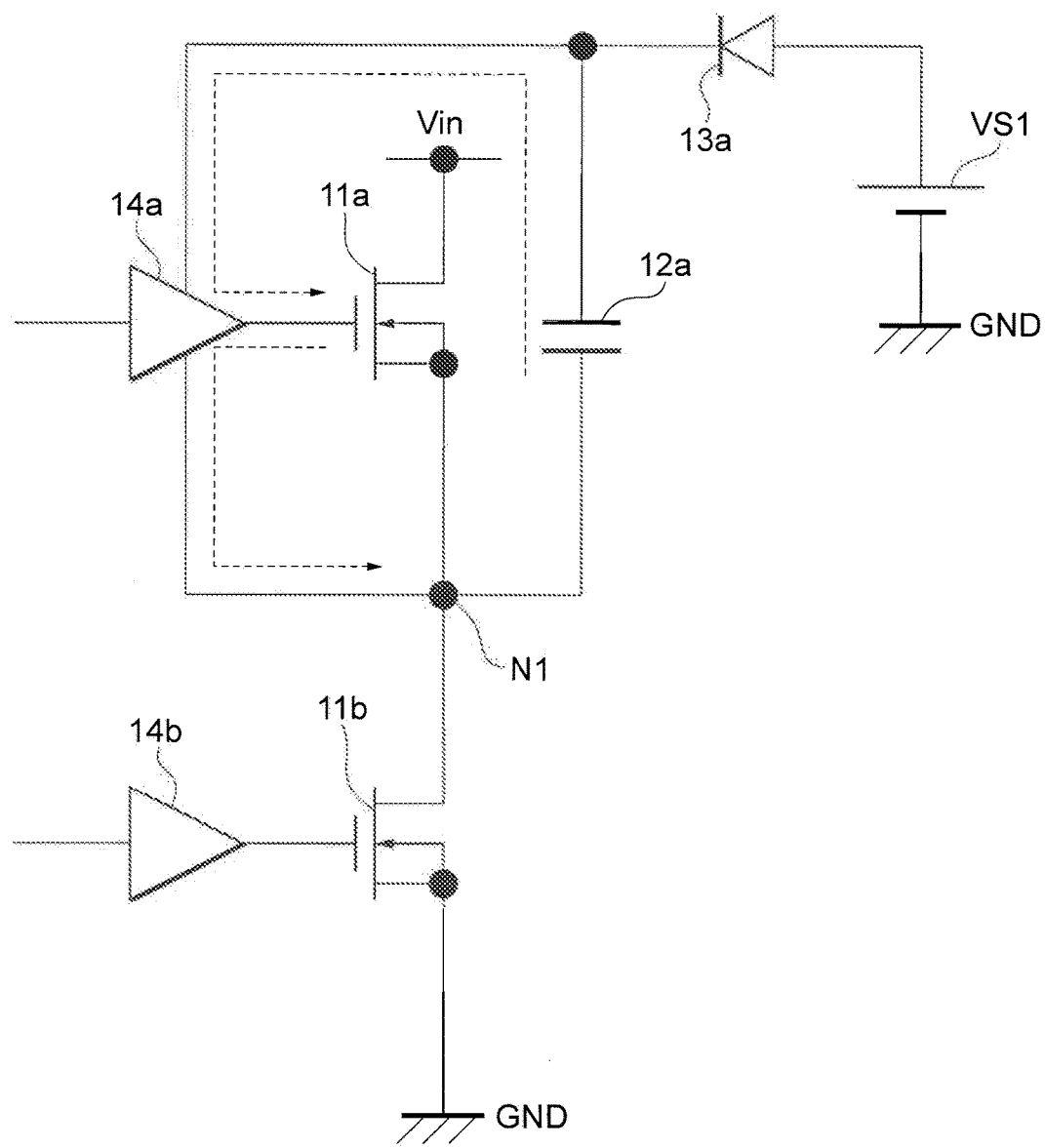
FIG. 2 is a circuit diagram describing the operation of primary switches in an output part of the buck-boost power supply, according to a first embodiment.

FIG. 2 is a circuit diagram describing the operation of the primary switches in the output part 10 in the first embodiment. The switch 11a which is the high-side switch of the primary switches is an N-channel MOSFET, and so is not driven unless a voltage greater than or equal to the input voltage Vin is applied. Accordingly, the charge (electrical energy) stored in the boost capacitor 12a is supplied to the gate of the switch 11a via the buffer circuit 14a, to turn on the switch 11a, as shown in FIG. 2. The charge supplied to the gate of the switch 11a is released from the node N1 to the ground GND or from the node N1 to the output via the inductor 15 shown in FIG. 1, to turn off the switch 11a. Thus, the charge in the boost capacitor 12a is used to turn on the switch 11a. To turn on the switch 11a again, the boost capacitor 12a needs to be charged.

Figure 3:
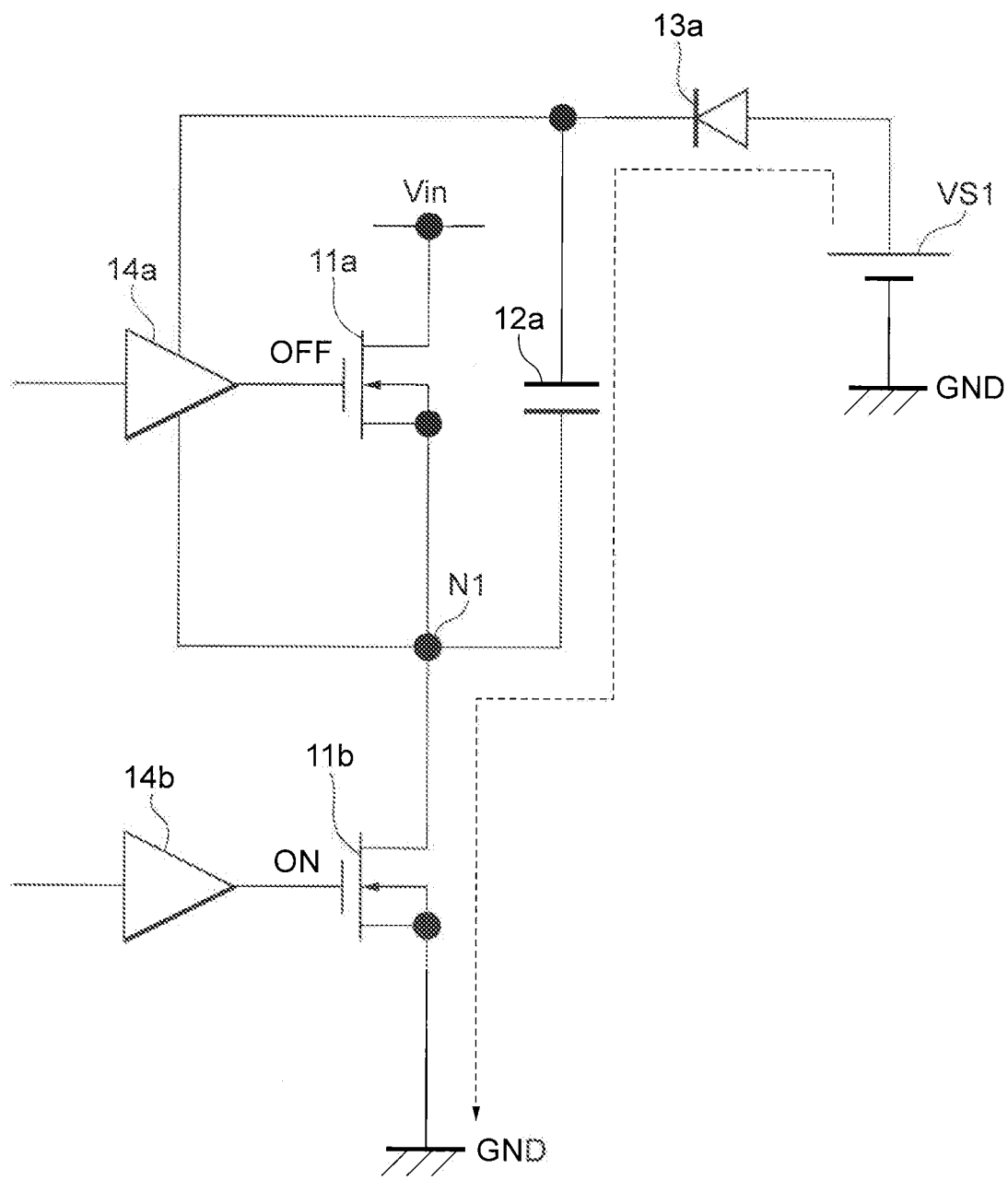
FIG. 3 is a circuit diagram describing the operation of charging a boost capacitor in an output part of the buck-boost power supply, according to a first embodiment.

FIG. 3 is a circuit diagram describing the operation of charging the boost capacitor 12a. When the switch 11a is off and the switch 11b is on, a voltage of a voltage source VS1 is applied to the boost capacitor 12a via the boost diode 13a, as shown in FIG. 3. Thus, the boost capacitor 12a is charged while the switch 11a is off and the switch 11b is on. The output part 10 in which the primary switches are both N-type transistors needs to have an opportunity to charge the boost capacitor 12a each time the primary switches are switched between on and off.

Figure 4:
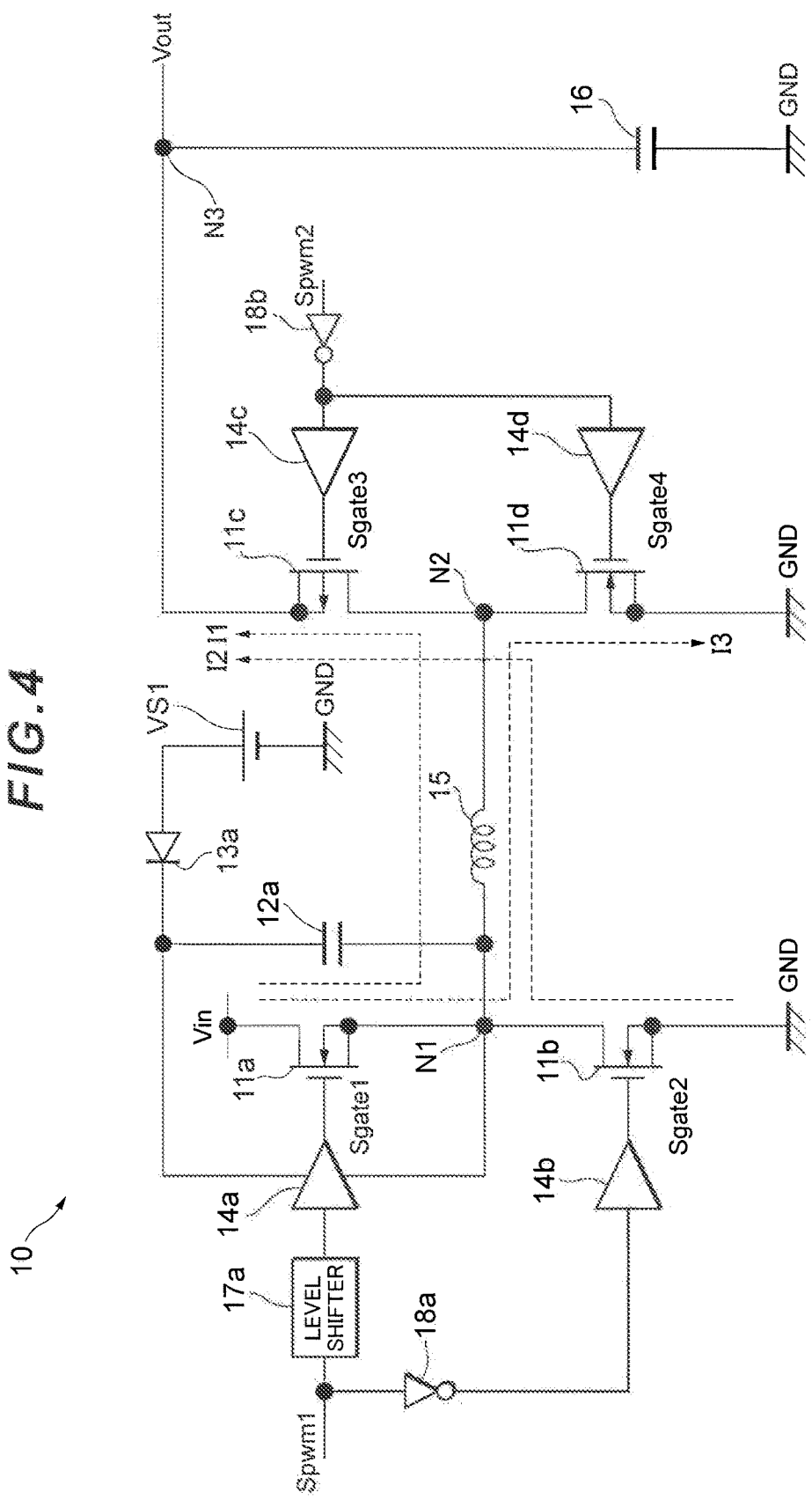
FIG. 4 is a circuit diagram describing the operation of the output part of the buck-boost power supply, according to a first embodiment.

FIG. 4 is a circuit diagram describing the operation of the output part 10 in the first embodiment. The output part 10 is controlled in three states, namely, a first state, a second state, and a third state, by the drive signals Sgate1 to Sgate4.

In the first state, the switches 11a and 11c are on, and the switches 11b and 11d are off. In this case, a current I1 flows in the output part 10, as shown in FIG. 4.

In the second state, the switches 11b and 11c are on, and the switches 11a and 11d are off. In this case, a current I2 flows in the output part 10. The time period of the second state corresponds to an example of "first time period."

In the third state, the switches 11a and 11d are on, and the switches 11b and 11c are off. In this case, a current I3 flows in the output part 10, and energy is stored in the inductor 15.

The output part 10 smoothes the current I1 in the first state and the current I2 in the second state by the smoothing capacitor 16, and supplies it to the external device as the output voltage Vout.

The output part 10 is switched between two modes: a buck or step-down mode (Vin>Vout) of stepping down the input voltage Vin to the output voltage Vout; and a boost or step-up mode (Vin<Vout) of stepping up the input voltage Vin to the output voltage Vout, based on the relation between the input voltage Vin and the output voltage Vout.

In the step-down mode, the output part 10 operates in cycles each of which is made up of the first state followed by the second state.

In the step-up mode, the output part 10 needs to perform switching for the third state to store energy in the inductor 15, in order to step up the input voltage Vin to the output voltage Vout. The output part 10 accordingly operates in cycles each of which is subsequently made up of, for example, the first state, the third state, and the second state. Alternatively, the output part 10 may operate in cycles each of which is subsequently made up of the first state, the second state, and the third state.

In both of the step-down mode and the step-up mode, each cycle includes the second state. In the second state, the switch 11a is off and the switch 11b is on, so that the boost capacitor 12a is charged by the voltage source VS1 and the boost diode 13a, as mentioned earlier. Namely, the second state is also the charge time for the boost capacitor 12a. The time period of the second state therefore needs to be longer than or equal to the time necessary for charging the boost capacitor 12a.

Figure 5:
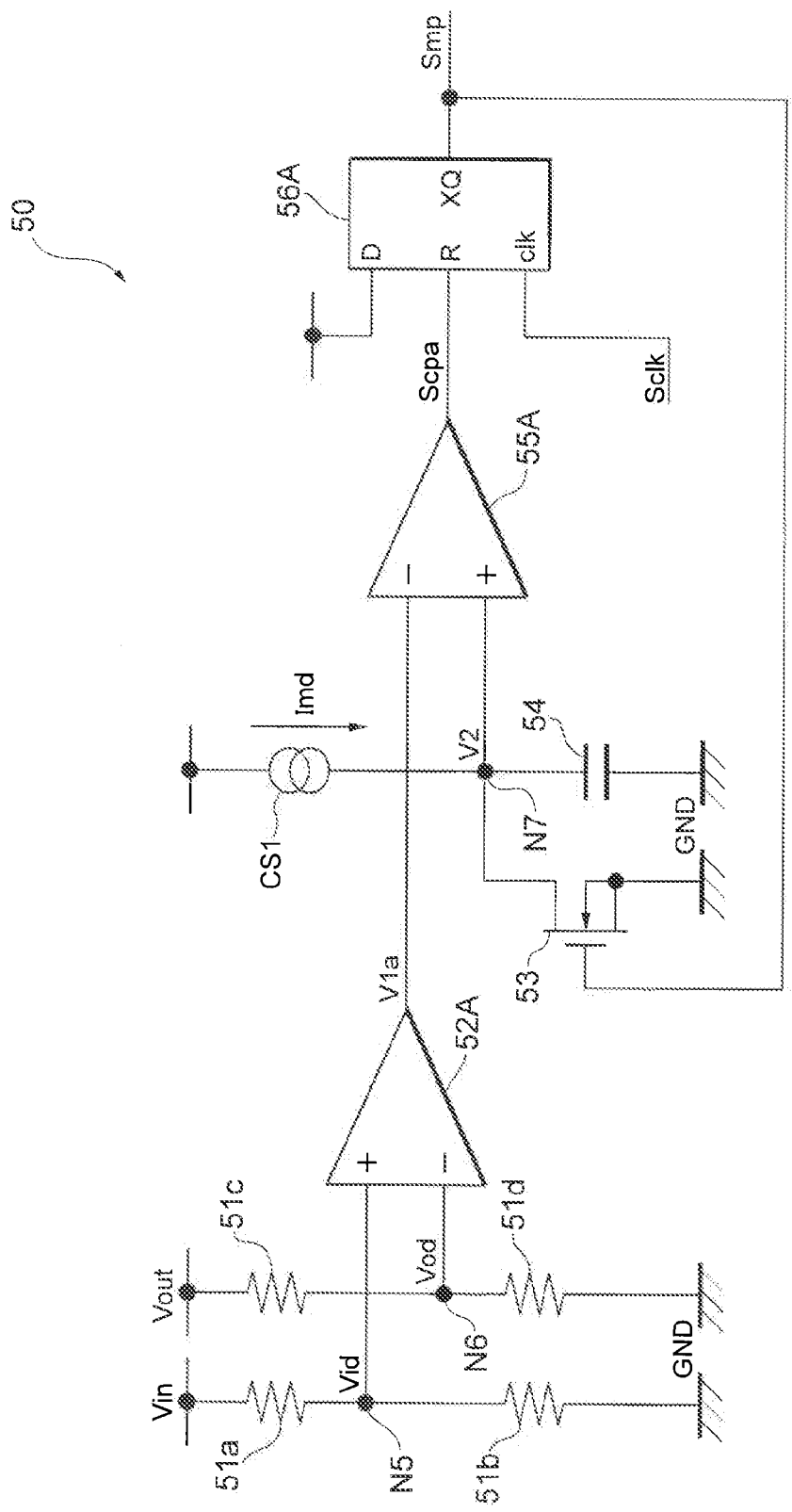
FIG. 5 is a circuit diagram showing a first example of a mode pulse signal generator, according to a first embodiment.

FIG. 5 is a circuit diagram showing a first example of the mode pulse signal generator 50 in the first embodiment. The mode pulse signal generator 50 is for generating a mode pulse signal Smp. The mode pulse signal generator 50 comprises resistors 51a, 51b, 51c, and 51d, an amplifier 52A, a switch element 53, a capacitor 54, a comparator 55A, and a flip flop circuit 56A, as shown in FIG. 5.

The resistor 51a has one end supplied with the input voltage Vin, and the other end connected to a node N5. The resistor 51b has one end connected to the node N5, and the other end connected to the ground GND. The resistor 51c has one end supplied with the output voltage Vout of the output part 10 shown in FIG. 1, and the other end connected to a node N6. The resistor 51d has one end connected to the node N6, and the other end connected to the ground GND. The resistors 51a and 51b generate a voltage Vid by dividing the input voltage Vin at a voltage division ratio corresponding to their resistances. The voltage Vid is a voltage proportional to the input voltage Vin. The resistors 51c and 51d generate a voltage Vod by dividing the output voltage Vout at a voltage division ratio corresponding to their resistances. The voltage Vod is a voltage proportional to the output voltage Vout.

The amplifier 52A has a non-inverting input terminal connected to the node N5, and an inverting input terminal connected to the node N6. The amplifier 52A amplifies the difference between the voltage Vid and the voltage Vod, and outputs a voltage V1a. The voltage V1a is a voltage proportional to the difference between the input voltage Vin and the output voltage Vout.

The switch element 53 is, for example, an N-channel MOSFET. The switch element 53 has a drain connected to a node N7, a source connected to the ground GND, and a gate to which the below-mentioned mode pulse signal Smp is input. The capacitor 54 has one end connected to the node N7, and the other end connected to the ground GND. The capacitor 54 is supplied with a current Imd from a current source CS1.

The comparator 55A has a non-inverting input terminal supplied with a voltage V2 of the node N7, and an inverting input terminal supplied with the voltage V1a of the amplifier 52A. The comparator 55A compares the voltage V2 and the voltage V1a, and outputs a signal Scpa corresponding to the comparison result. The comparator 55A outputs the signal Scpa of H level in the case where the voltage V2 is higher than the voltage V1a, and outputs the signal Scpa of L level in the case where the voltage V2 is not higher than the voltage V1a.

The flip flop circuit 56A is, for example, a D-type flip flop circuit. The flip flop circuit 56A has a reset terminal to which the signal Scpa of the comparator 55A is input, a clock input terminal to which the clock signal Sclk of the period T is input from the oscillator OSC shown in FIG. 1, and a data input terminal, which is pulled up to a high voltage level for example.

The flip flop circuit 56A changes the level of the mode pulse signal Smp output from its inverting output terminal XQ, based on the signal Scpa and the clock signal Sclk. For example, the flip flop circuit 56A makes the mode pulse signal Smp fall to L level in response to L level of the clock signal Sclk, and makes the mode pulse signal Smp rise to H level in response to H level of the signal Scpa. Thus, the flip flop circuit 56A outputs the mode pulse signal Smp of L level, during the time period from the falling edge of the clock signal Sclk to the rising edge of the signal Scpa. The flip flop circuit 56A also outputs the mode pulse signal Smp of H level, during the time period from the rising edge of the signal Scpa to the falling edge of the clock signal Sclk. The mode pulse signal Smp completes one cycle between the falling edges of the clock signal Sclk, and so has the same period as the period T of the clock signal Sclk.

For example, when the clock signal Sclk falls and the mode pulse signal Smp becomes L level, the switch element 53 is turned off. As a result, the capacitor 54 is charged with the current Imd from the current source CS1, and the voltage V2 of the node N7 increases with a predetermined gradient over time. When the voltage V2 exceeds the voltage V1a of the amplifier 52A, the signal Scpa of the comparator 55A becomes H level, and the mode pulse signal Smp of the flip flop circuit 56A becomes H level, too. The switch element 53 is thus turned on. As a result, the charge stored in the capacitor 54 is released, and the voltage V2 of the node N7 reaches approximately ground GND level. The signal Scpa of the comparator 55A accordingly becomes L level.

Subsequently, when the clock signal Sclk falls again, the mode pulse signal Smp becomes L level, and the switch element 53, the comparator 55A, and the flip flop circuit 56A repeat the above-mentioned operation. Therefore, the signal Scpa of the comparator 55A is L level during the time period proportional to the difference between the input voltage Vin and the output voltage Vout. Likewise, the mode pulse signal Smp of the flip flop circuit 56A is L level during the time period proportional to the difference between the input voltage Vin and the output voltage Vout, in the period T of the clock signal Sclk.

The mode pulse signal Smp is not limited to having a signal of L level during the time period proportional to the difference between the input voltage Vin and the output voltage Vout. For example, the mode pulse signal generator 50 may generate the mode pulse signal Smp having a signal of L level during the time period proportional to the input voltage Vin, or the mode pulse signal Smp having a signal of L level during the time period proportional to the difference between the input voltage Vin and the reference voltage Vr.

Figure 6:
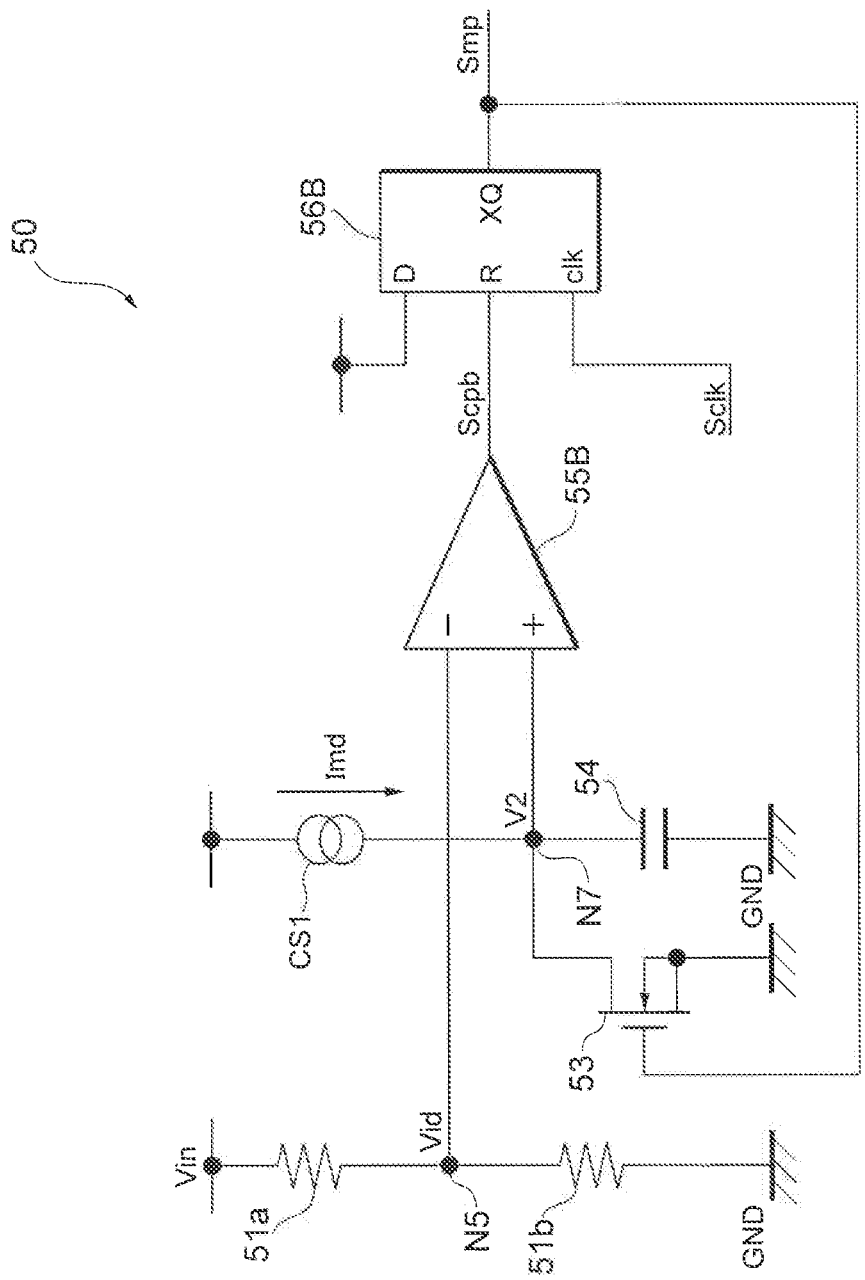
FIG. 6 is a circuit diagram showing a second example of the mode pulse signal generator, according to a first embodiment.

FIG. 6 is a circuit diagram showing a second example of the mode pulse signal generator 50 in the first embodiment.

The mode pulse signal generator 50 comprises the resistors 51a and 51b, the switch element 53, the capacitor 54, a comparator 55B, and a flip flop circuit 56B, as shown in FIG. 6. The resistors 51a and 51b, the switch element 53, and the capacitor 54 are the same as those in the mode pulse signal generator 50 shown in FIG. 5, and so their description is omitted.

The comparator 55B has a non-inverting input terminal supplied with the voltage V2 of the node N7, and an inverting input terminal supplied with the voltage Vid of the node N5. The comparator 55B compares the voltage V2 and the voltage Vid, and outputs a signal Scpb corresponding to the comparison result. The comparator 55B outputs the signal Scpb of H level in the case where the voltage V2 is higher than the voltage Vid, and outputs the signal Scpb of L level in the case where the voltage V2 is not higher than the voltage Vid.

The flip flop circuit 56B is, for example, a D-type flip flop circuit. The flip flop circuit 56B has a reset terminal to which the signal Scpb of the comparator 55B is input, a clock input terminal to which the clock signal Sclk of the period T is input from the oscillator OSC shown in FIG. 1, and a data input terminal, which is pulled up to a high voltage level for example.

The flip flop circuit 56B changes the level of the mode pulse signal Smp output from its inverting output terminal XQ, based on the signal Scpb and the clock signal Sclk. For example, the flip flop circuit 56B makes the mode pulse signal Smp fall to L level in response to L level of the clock signal Sclk, and makes the mode pulse signal Smp rise to H level in response to H level of the signal Scpb. Thus, the flip flop circuit 56B outputs the mode pulse signal Smp of L level, during the time period from the falling edge of the clock signal Sclk to the rising edge of the signal Scpb. The flip flop circuit 56B also outputs the mode pulse signal Smp of H level, during the time period from the rising edge of the signal Scpb to the falling edge of the clock signal Sclk. The mode pulse signal Smp completes one cycle between the falling edges of the clock signal Sclk, and so has the same period as the period T of the clock signal Sclk.

For example, when the clock signal Sclk falls and the mode pulse signal Smp becomes L level, the switch element 53 is turned off. As a result, the capacitor 54 is charged with the current Imd from the current source CS1, and the voltage V2 of the node N7 increases with a predetermined gradient over time. When the voltage V2 exceeds the voltage Vid, the signal Scpb of the comparator 55B becomes H level, and the mode pulse signal Smp of the flip flop circuit 56B becomes H level, too. The switch element 53 is thus turned on. As a result, the charge stored in the capacitor 54 is released, and the voltage V2 of the node N7 reaches approximately ground GND level. The signal Scpb of the comparator 55B accordingly becomes L level.

Subsequently, when the clock signal Sclk falls again, the mode pulse signal Smp becomes L level, and the switch element 53, the comparator 55B, and the flip flop circuit 56B repeat the above-mentioned operation. Thus, the signal Scpb of the comparator 55B is L level during the time period proportional to the input voltage Vin. Likewise, the mode pulse signal Smp of the flip flop circuit 56B is L level during the time period proportional to the input voltage Vin, in the period T of the clock signal Sclk.

Figure 7:
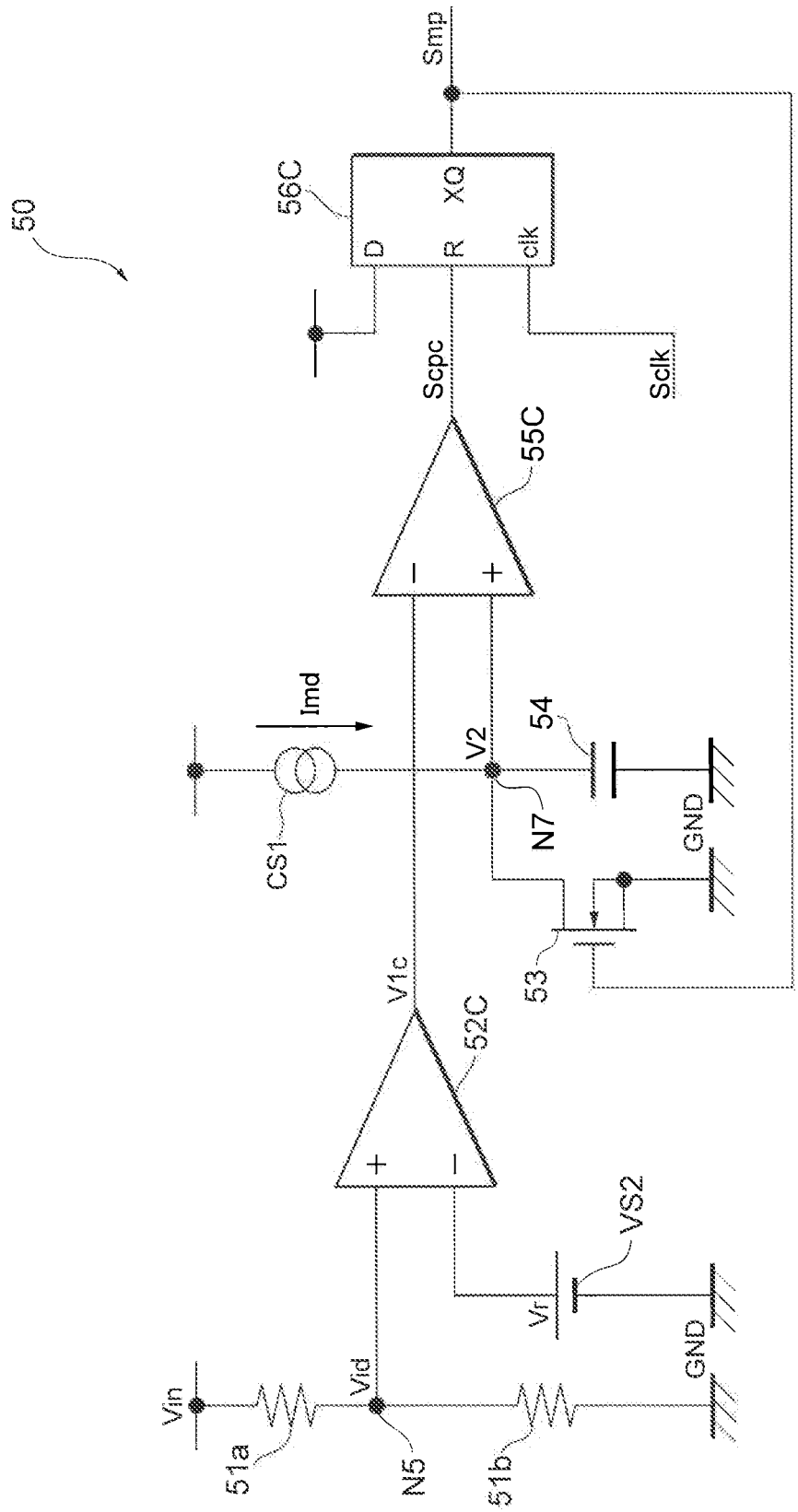
FIG. 7 is a circuit diagram showing a third example of the mode pulse signal generator, according to a first embodiment.

FIG. 7 is a circuit diagram showing a third example of the mode pulse signal generator 50 in the first embodiment. The mode pulse signal generator 50 comprises the resistors 51a and 51b, an amplifier 52C, the switch element 53, the capacitor 54, a comparator 55C, and a flip flop circuit 56C, as shown in FIG. 7. The resistors 51a and 51b, the switch element 53, and the capacitor 54 are the same as those in the mode pulse signal generator 50 shown in FIG. 5, and so their description is omitted.

The amplifier 52C has a non-inverting input terminal connected to the node N5, and an inverting input terminal supplied with the reference voltage Vr from the voltage source VS2 shown in FIG. 1. The reference voltage Vr is a voltage proportional to the output voltage, as mentioned earlier. The amplifier 52C amplifies the difference between the voltage Vid and the reference voltage Vr, and outputs a voltage V1c. The voltage V1c is a voltage proportional to the difference between the input voltage Vin and the reference voltage Vr.

The comparator 55C has a non-inverting input terminal supplied with the voltage V2 of the node N7, and an inverting input terminal supplied with the voltage V1c of the amplifier 52C. The comparator 55C compares the voltage V2 and the voltage V1c, and outputs a signal Scpc corresponding to the comparison result. The comparator 55C outputs the signal Scpc of H level in the case where the voltage V2 is higher than the voltage Vie, and outputs the signal Scpc of L level in the case where the voltage V2 is not higher than the voltage V1c.

The flip flop circuit 56C is, for example, a D-type flip flop circuit. The flip flop circuit 56C has a reset terminal to which the signal Scpc of the comparator 55C is input, a clock input terminal to which the clock signal Sclk of the period T is input from the oscillator OSC shown in FIG. 1, and a data input terminal, which is pulled up to a high voltage level for example.

The flip flop circuit 56C changes the level of the mode pulse signal Smp output from its inverting output terminal XQ, based on the signal Scpc and the clock signal Sclk. For example, the flip flop circuit 56C makes the mode pulse signal Smp fall to L level in response to L level of the clock signal Sclk, and makes the mode pulse signal Smp rise to H level in response to H level of the signal Scpc. Thus, the flip flop circuit 56C outputs the mode pulse signal Smp of L level, during the time period from the falling edge of the clock signal Sclk to the rising edge of the signal Scpc. The flip flop circuit 56C also outputs the mode pulse signal Smp of H level, during the time period from the rising edge of the signal Scpc to the falling edge of the clock signal Sclk. The mode pulse signal Smp completes one cycle between the falling edges of the clock signal Sclk, and so has the same period as the period T of the clock signal Sclk.

For example, when the clock signal Sclk falls and the mode pulse signal Smp becomes L level, the switch element 53 is turned off. As a result, the capacitor 54 is charged with the current Imd from the current source CS1, and the voltage V2 of the node N7 increases with a predetermined gradient over time. When the voltage V2 exceeds the voltage V1c of the amplifier 52C, the signal Scpc of the comparator 55C becomes H level, and the mode pulse signal Smp of the flip flop circuit 56C becomes H level, too. The switch element 53 is thus turned on. As a result, the charge stored in the capacitor 54 is released, and the voltage V2 of the node N7 reaches approximately ground GND level. The signal Scpc of the comparator 55C accordingly becomes L level.

Subsequently, when the clock signal Sclk falls again, the mode pulse signal Smp becomes L level, and the switch element 53, the comparator 55C, and the flip flop circuit 56C repeat the above-mentioned operation. Thus, the signal Scpc of the comparator 55C is L level during the time period proportional to the difference between the input voltage Vin and the reference voltage Vr. Likewise, the mode pulse signal Smp of the flip flop circuit 56C is L level during the time period proportional to the difference between the input voltage Vin and the reference voltage Vr, in the period T of the clock signal Sclk.

The mode pulse signal Smp is not limited to having a signal of L level during the time period that is based on the difference between the input voltage Vin and the output voltage Vout, the input voltage Vin, or the difference between the input voltage Vin and the reference voltage Vr, i.e. the difference between the input voltage Vin and a voltage proportional to the output voltage. For example, the mode pulse signal generator 50 may generate the mode pulse signal Smp having a signal of H level, namely, a pulse, during the time period that is based on the difference between the input voltage Vin and the output voltage Vout, the input voltage Vin, or the difference between the input voltage Vin and a voltage proportional to the output voltage. In the following description, the mode pulse signal Smp is assumed to be generated by the mode pulse signal generator 50 shown in FIG. 5, unless stated otherwise.

Figure 8:
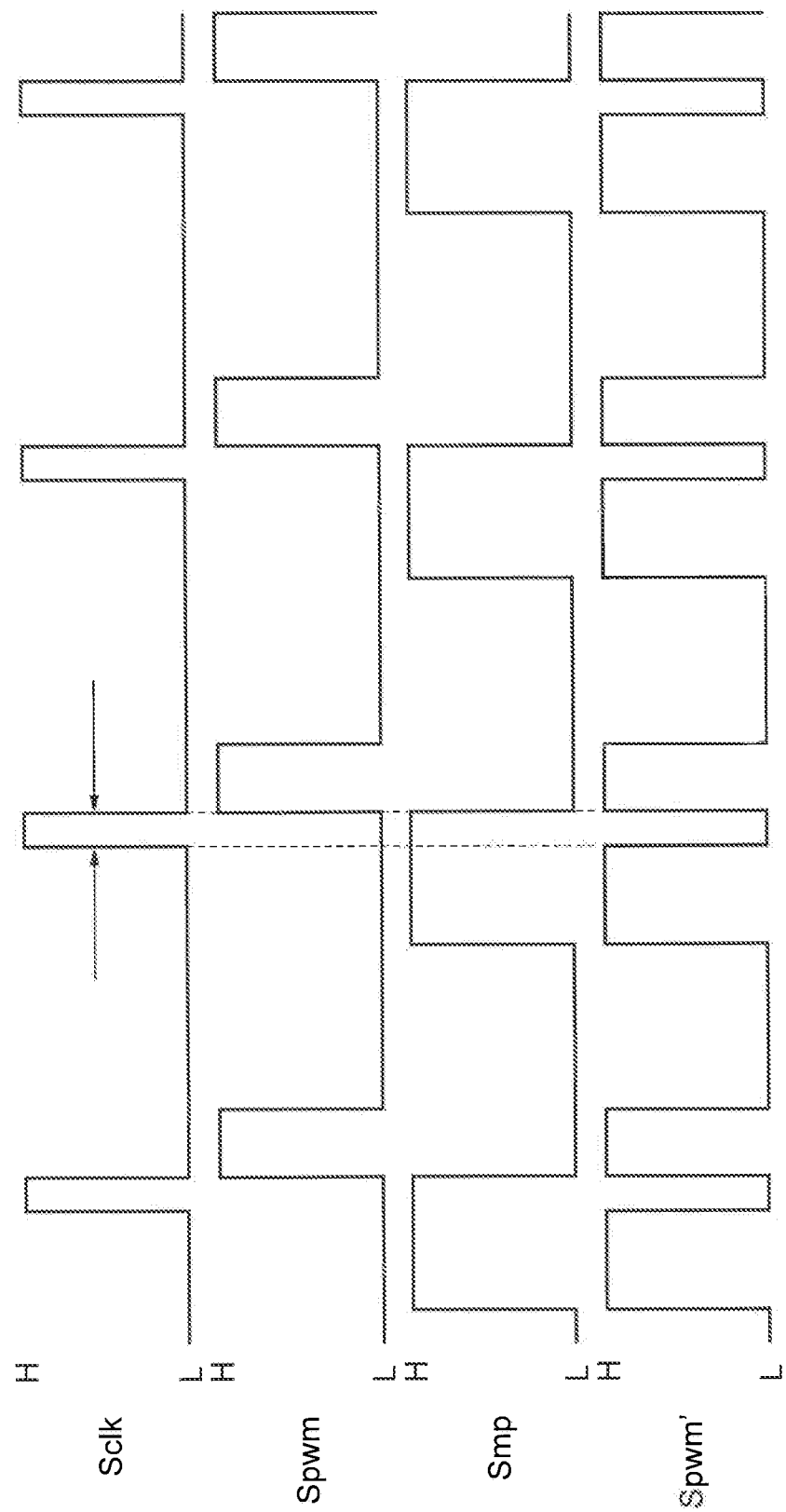
FIG. 8 is a waveform diagram describing the operation of a control apparatus according to a first example embodiment.

FIG. 8 is a waveform diagram describing the operation of a hypothetical control apparatus. The hypothetical control apparatus based on conventional techniques controls the buck-boost power supply 100, and comprises the same PWM signal generator 40 and mode pulse signal generator 50 as the control apparatus 20. For example, in the hypothetical control apparatus, the PWM signal Spwm and the mode pulse signal Smp are input to a NOR circuit to generate a signal, and the generated signal and the clock signal Sclk of the oscillator OSC are input to a NOR circuit to generate a control signal Spwm'. The control signal Spwm' generated by the control apparatus is input to the gate of the switch 11a via the level shifter 17a and the buffer circuit 14a, and also input to the gate of the switch 11b via the inverter circuit 18a and the buffer circuit 14b. As shown in FIG. 8, the control signal Spwm' is L level during the pulse width of the clock signal Sclk of the oscillator OSC. During this time, the switch 11a is off and the switch 11b is on. Hence, the hypothetical control apparatus can ensure the time period of the second state mentioned above, in the buck-boost power supply 100.

However, since the control signal Spwm' is forced to be L level during the pulse width of the clock signal Sclk, the switching frequency of the output part 10 according to the control signal Spwm' is twice the frequency of the clock signal Sclk. This can lead to problems such as increased gate charge loss of the switches 11a and 11b, decreased power conversion efficiency of the switching power supply, and noise.

Figure 9:
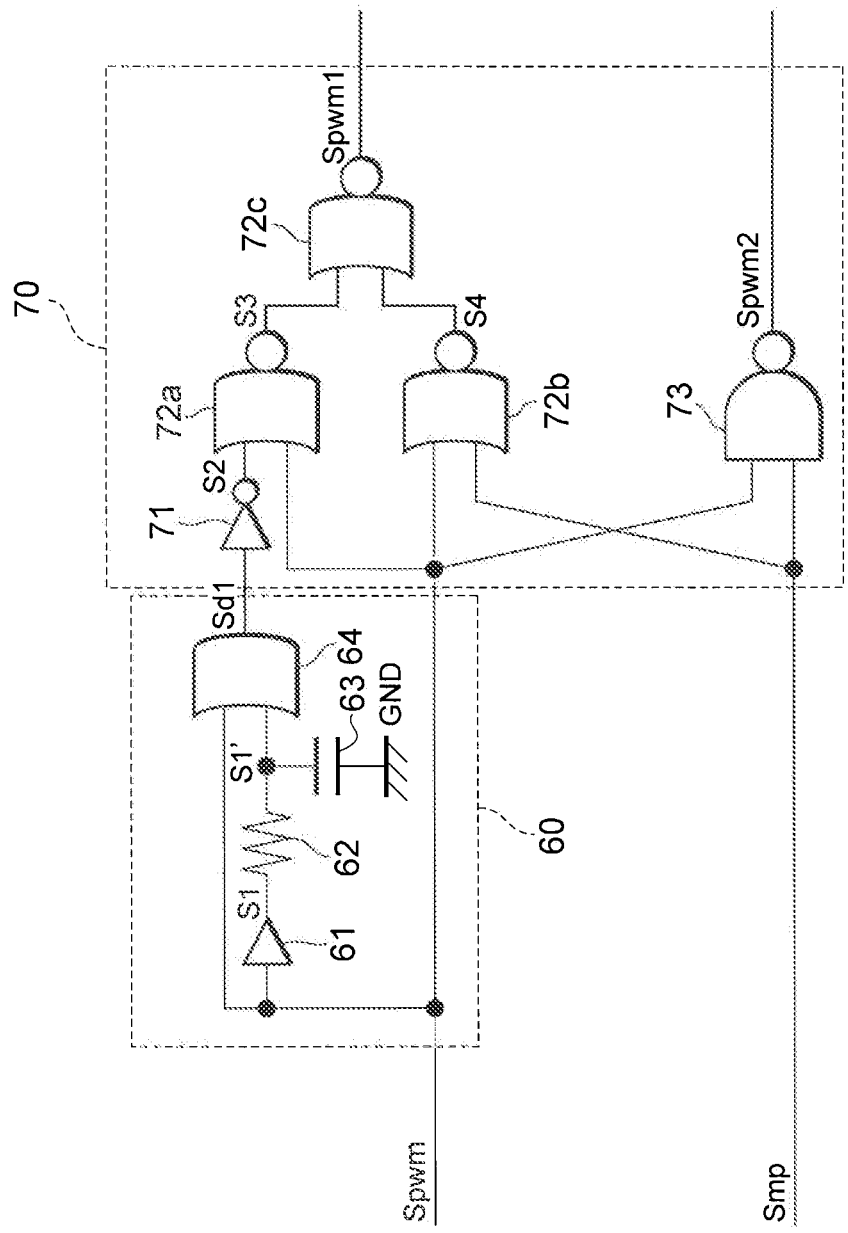
FIG. 9 is a circuit diagram showing an example of a first delayed signal generator and a first example of an output controller, according to a first embodiment.

FIG. 9 is a circuit diagram showing an example of the first delayed signal generator 60 and a first example of the output controller 70 in the first embodiment. The first delayed signal generator 60 is for generating a first delayed signal Sd1. The first delayed signal generator 60 comprises, for example, a buffer circuit 61, a resistor 62, a capacitor 63, and an OR circuit 64, as shown in FIG. 9.

The buffer circuit 61 receives input of the PWM signal Spwm of the flip flop circuit 42 shown in FIG. 1, and outputs a signal S1. The signal S1 is input to the OR circuit 64 via the resistor 62 and the capacitor 63 to generate a signal S1'.

The OR circuit 64 also receives input of the PWM signal Spwm of the flip flop circuit 42 shown in FIG. 1. The OR circuit 64 performs a logical OR between the signal S1' and the PWM signal Spwm, and outputs the first delayed signal Sd1.

The output controller 70 is for controlling the output part 10 shown in FIG. 1. The output controller 70 is configured to control the output part 10 based on the PWM signal Spwm of the PWM signal generator 40 shown in FIG. 1, the mode pulse signal Smp of the mode pulse signal generator 50 shown in FIG. 1, and the first delayed signal Sd1 of the first delayed signal generator 60. The output controller 70 comprises, for example, an inverter circuit 71, NOR circuits 72a, 72b, and 72c, and a NAND circuit 73.

The inverter circuit 71 receives input of the first delayed signal Sd1 of the OR circuit 64. The inverter circuit 71 inverts the first delayed signal Sd1, and outputs a signal S2.

The NOR circuit 72a receives input of the signal S2 of the inverter circuit 71 and the PWM signal Spwm of the flip flop circuit 42 shown in FIG. 1. The NOR circuit 72a performs a logical NOR between the signal S2 and the PWM signal Spwm, and outputs a signal S3.

The NOR circuit 72b receives input of the PWM signal Spwm of the flip flop circuit 42 shown in FIG. 1 and the mode pulse signal Smp of the mode pulse signal generator 50 shown in FIG. 1. The NOR circuit 72b performs a logical NOR between the PWM signal Spwm and the mode pulse signal Smp, and outputs a signal S4.

The NOR circuit 72c receives input of the signal S3 of the NOR circuit 72a and the signal S4 of the NOR circuit 72b. The NOR circuit 72c performs a logical NOR between the signal S3 and the signal S4, and outputs the first control signal Spwm1.

The first control signal Spwm1 generated in this way is a signal for controlling the primary switches in the output part 10. In detail, the first control signal Spwm1 is input to the switch 11a, which is the high-side switch of the primary switches via the level shifter 17a and the buffer circuit 14a shown in FIG. 1, as the above-mentioned drive signal Sgate1. The first control signal Spwm1 is also input to the switch 11b, which is the low-side switch of the primary switches via the inverter circuit 18a and the buffer circuit 14b shown in FIG. 1, as the above-mentioned drive signal Sgate2.

The NAND circuit 73 receives input of the PWM signal Spwm of the flip flop circuit 42 shown in FIG. 1 and the mode pulse signal Smp of the mode pulse signal generator 50 shown in FIG. 1. The NAND circuit 73 performs a logical NAND between the PWM signal Spwm and the mode pulse signal Smp, and outputs the second control signal Spwm2.

The second control signal Spwm2 generated in this way is a signal for controlling the secondary switches in the output part 10. In detail, the second control signal Spwm2 is input to the switch 11c, which is the high-side switch of the secondary switches via the inverter circuit 18b and the buffer circuit 14c shown in FIG. 1, as the above-mentioned drive signal Sgate3. The second control signal Spwm2 is also input to the switch 11d, which is the low-side switch of the secondary switches via the inverter circuit 18b and the buffer circuit 14d shown in FIG. 1, as the above-mentioned drive signal Sgate4.

Figure 10:
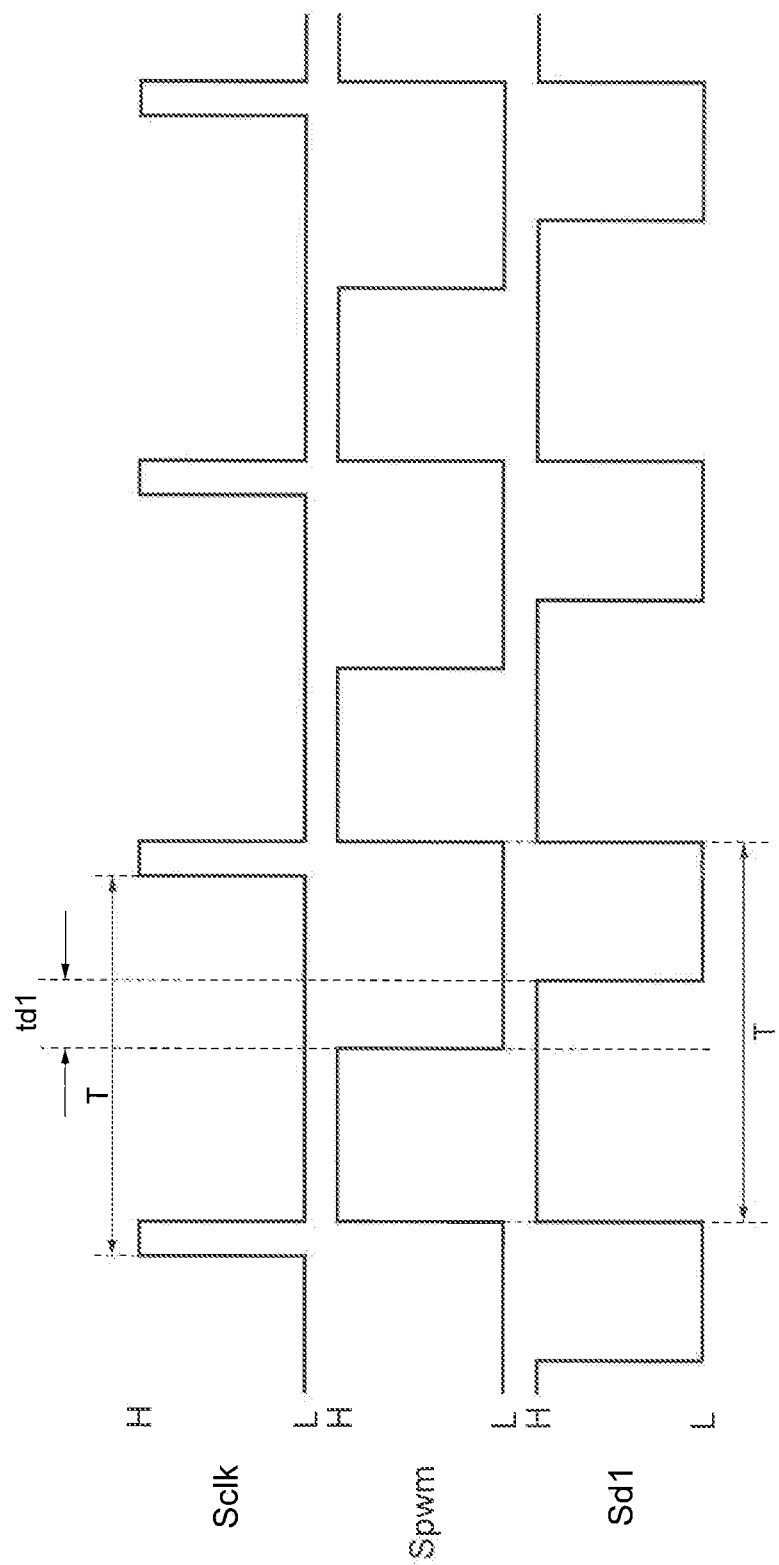
FIG. 10 is a waveform diagram describing a first delayed signal.

FIG. 10 is a waveform diagram describing the first delayed signal Sd1. As shown in FIG. 10, the first delayed signal Sd1 rises to H level in response to H level of the PWM signal Spwm, and falls to L level with a first delay time td1 in response to L level of the PWM signal Spwm, i.e. the falling edge of the pulse of the PWM signal Spwm. In other words, the first delayed signal Sd1 has a pulse whose pulse width, i.e. the time period of H level, is longer than the pulse width of the PWM signal Spwm by the first delay time td1. The first delayed signal Sd1 has the same period as the period T of the clock signal Sclk of the oscillator OSC, as is also the case for the PWM signal Spwm. Accordingly, the time period of L level of the first delayed signal Sd1 is shorter than the time period of L level of the PWM signal Spwm by the first delay time td1.

Although FIG. 10 shows an example of the first delayed signal Sd1 that rises to H level in response to H level of the PWM signal Spwm and whose falling edge is delayed for the first delay time td1 from the falling edge of the pulse of the PWM signal Spwm, this is not a limitation. As an example, the first delayed signal Sd1 may have the rising edge delayed for the first delay time td1 from the falling edge of the pulse of the PWM signal Spwm, and fall to L level in response to H level of the PWM signal Spwm. As another example, the first delayed signal Sd1 may rise in response to L level of the PWM signal Spwm, and have the falling edge delayed for the first delay time td1 from the falling edge of the pulse of the PWM signal Spwm. As another example, the first delayed signal Sd1 may fall in response to L level of the PWM signal Spwm, and have the rising edge delayed for the first delay time td1 from the falling edge of the pulse of the PWM signal Spwm. Thus, the first delayed signal Sd1 simply needs to have a pulse whose rising edge or falling edge is delayed for the first delay time td1 from the rising edge or falling edge of the pulse of the PWM signal Spwm. The first delayed signal generator 60 shown in FIG. 9 is appropriately configured to generate the corresponding first delayed signal Sd1.

The first delay time td1 is set based on the boost capacitor 12a shown in FIG. 1. For example, the resistance of the resistor 62 and the capacitance of the capacitor 63 are set based on the capacitance of the boost capacitor 12a and the like. Therefore, the first delay time td1 can be set to the same length as the time necessary for charging the boost capacitor 12a.

Figure 11:
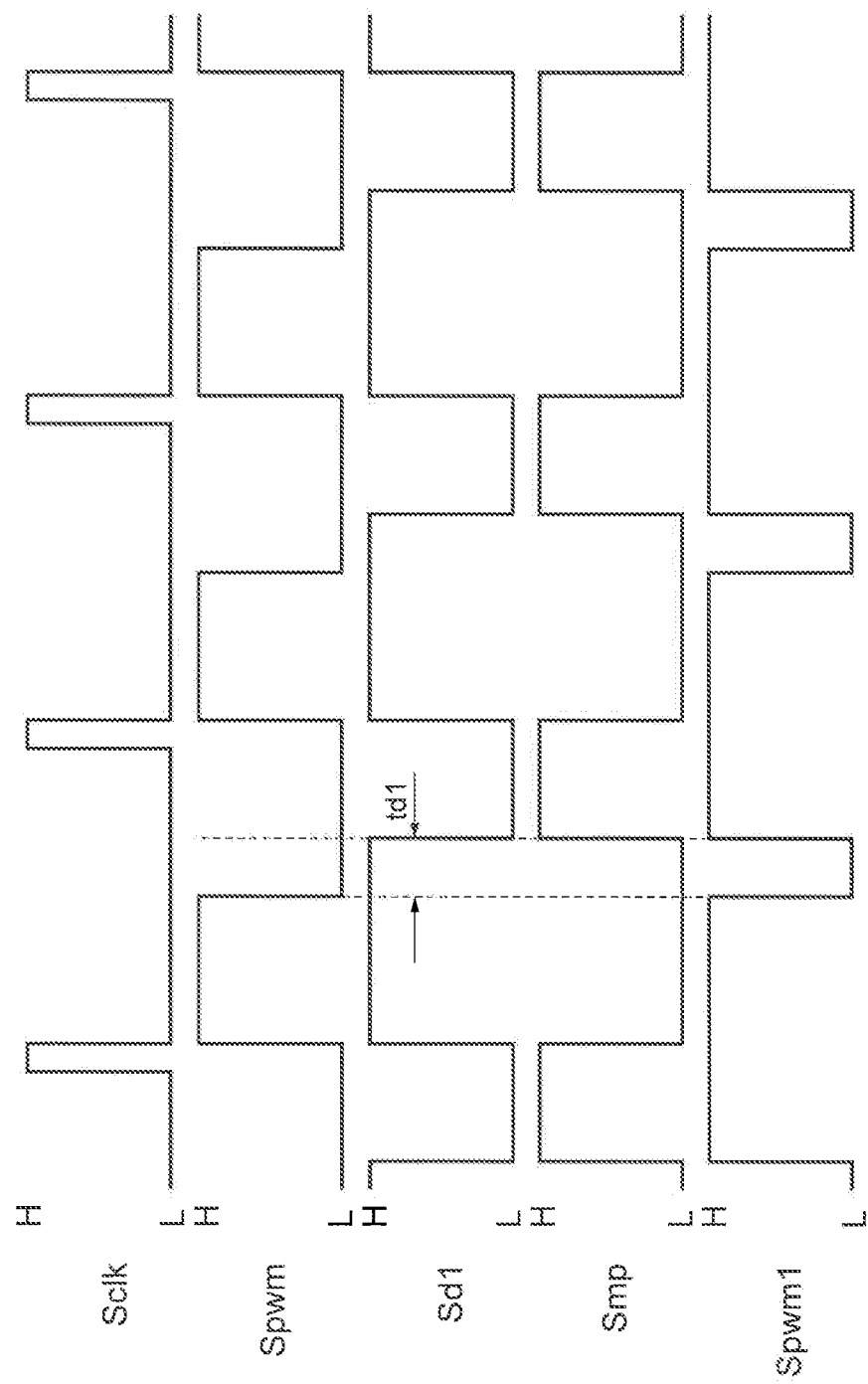
FIG. 11 is a waveform diagram describing the operation of the output controller shown in FIG. 9.

FIG. 11 is a waveform diagram describing the operation of the output controller 70 shown in FIG. 9. The first control signal Spwm1 is generated based on the PWM signal Spwm, the mode pulse signal Smp, and the first delayed signal Sd1, and so has the same period as the period T of the clock signal Sclk, as is also the case with the other signals, as shown in FIG. 11. Therefore, the switching frequency of the output part 10 can be made equal to the frequency of the clock signal Sclk.

The output controller 70 generates the first control signal Spwm1 so that the time period of L level is longer than or equal to the first delay time td1. While the first control signal Spwm1 is L level, the switch 11a is off, and the switch 11b is on. In other words, while the first control signal Spwm1 is L level, the switch 11a and the switch 11b which are the primary switches are in the second state. Since the time period of the second state is longer than or equal to the first delay time td1, the charge time for the boost capacitor 12a can be ensured in each cycle of the step-down mode and the step-up mode.

Figure 12:
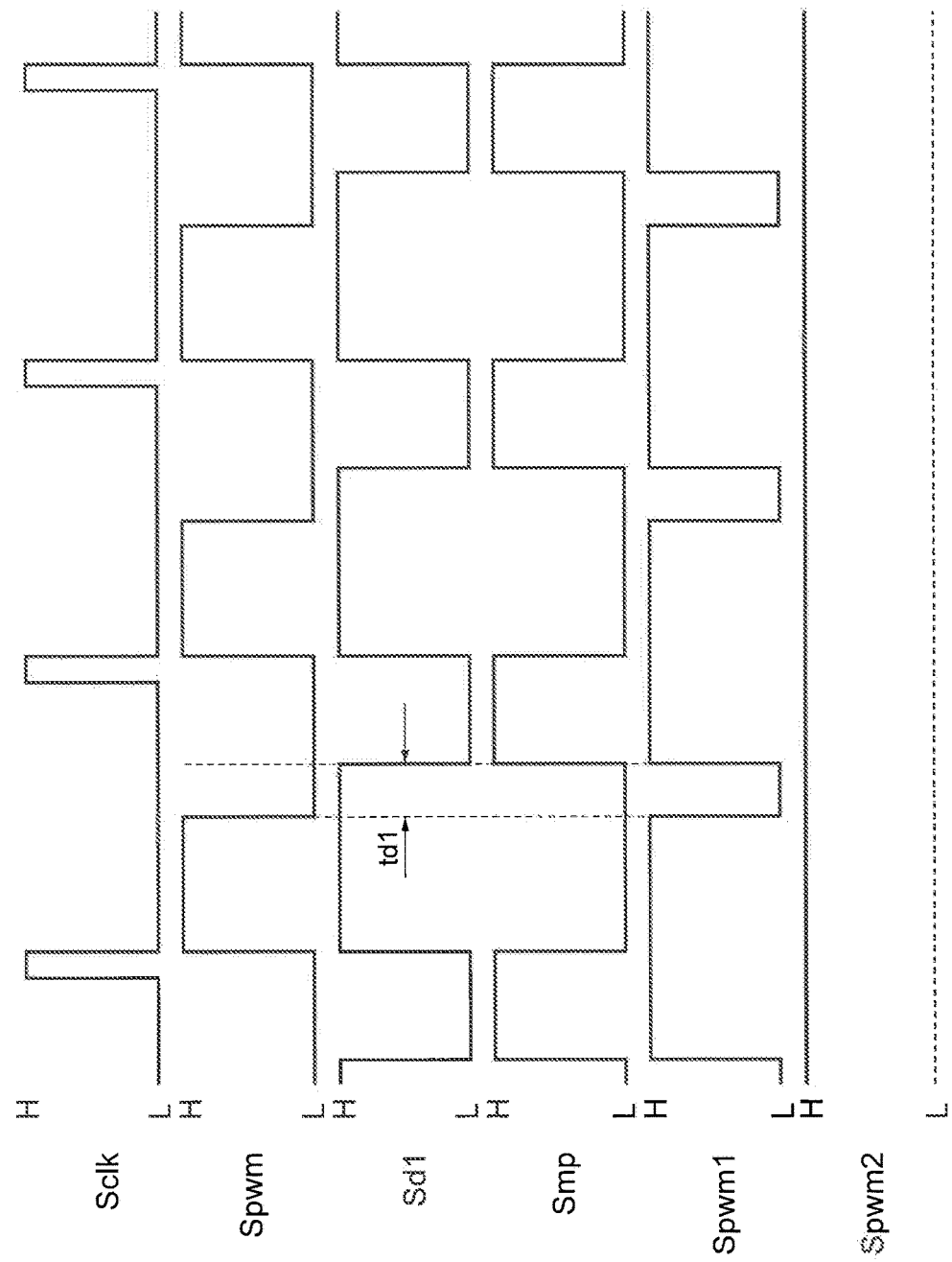
FIG. 12 is a waveform diagram describing the operation of the output controller shown in FIG. 9.
Figure 13:
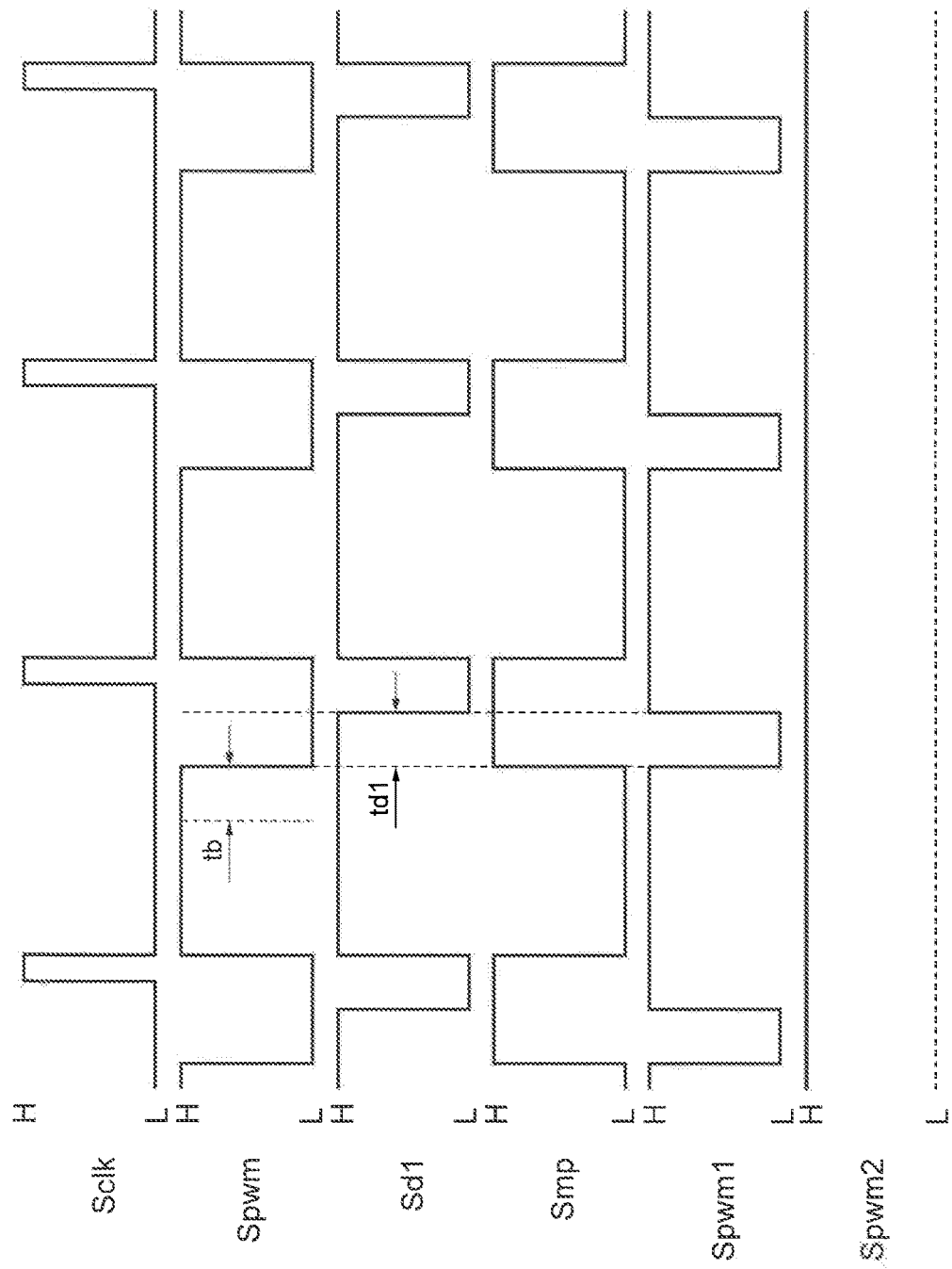
FIG. 13 is a waveform diagram describing the operation of the output controller shown in FIG. 9.

FIGS. 12 and 13 are each a waveform diagram describing the operation of the output controller 70 shown in FIG. 9. If the time period during which the PWM signal Spwm is at H level, i.e. the pulse width of the PWM signal Spwm, becomes long, there is a possibility that the falling edge of the first delayed signal Sd1 coincides with the rising edge of the mode pulse signal Smp, as shown in FIG. 12. If the pulse width of the PWM signal Spwm is longer than that shown in FIG. 12, the time period of H level of the signal S3 of the NOR circuit 72a shown in FIG. 9 is equal to the first delay time td1, whereas the time period of H level of the signal S4 of the NOR circuit 72b shown in FIG. 9 is shorter than the first delay time td1. As a result, the time period of L level of the first control signal Spwm1 output from the NOR circuit 72c shown in FIG. 9 is equal to the first delay time td1. Thus, even if the pulse width of the PWM signal Spwm is longer than that shown in FIG. 12, the pulse width of the first control signal Spwm1 is unchanged. The second control signal Spwm2 is generated by the NAND circuit 73 shown in FIG. 9 performing a logical NAND between the PWM signal Spwm and the mode pulse signal Smp. Therefore, the second control signal Spwm2 is unchanged and remains at H level in the whole time period as shown in FIGS. 12 and 13 until the pulse width of the PWM signal Spwm is longer than that in the state as shown in FIG. 13 where the falling edge of the PWM signal Spwm coincides with the rising edge of the mode pulse signal Smp. In such a case, the output controller 70 cannot switch the secondary switches in the output part 10. Thus, the pulse width of the PWM signal Spwm includes a blank time period tb in which the pulse width of the first control signal Spwm1 is unchanged and the second control signal Spwm2 is unchanged.

Figure 14:
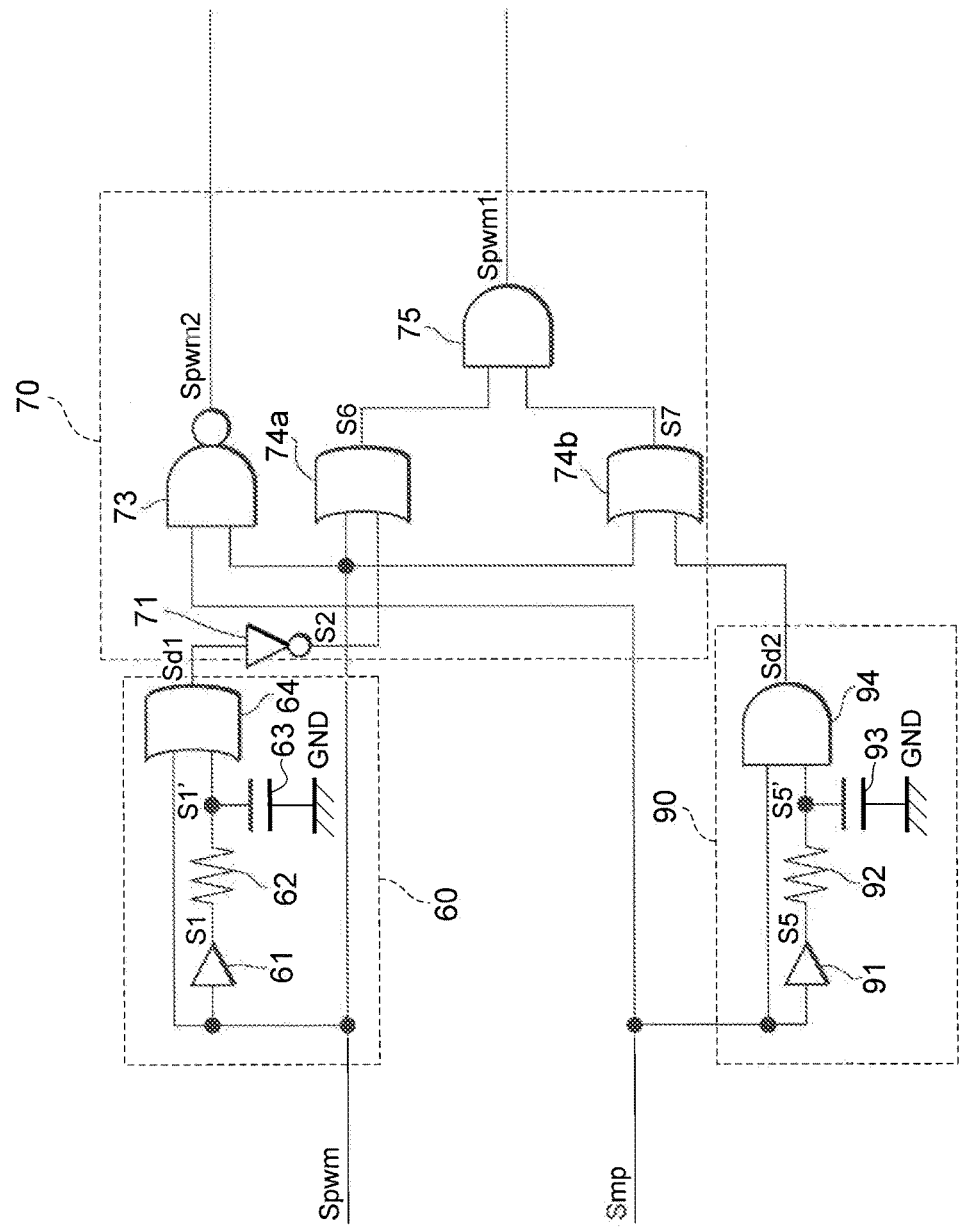
FIG. 14 is a circuit diagram showing a second example of the output controller and an example of a second delayed signal generator, according to a first embodiment.

FIG. 14 is a circuit diagram showing a second example of the output controller 70 and an example of a second delayed signal generator 90 in the first embodiment. The first delayed signal generator 60 is the same as that in FIG. 9, and so its description is omitted. The control apparatus 20 shown in FIG. 1 further comprises the second delayed signal generator 90, as shown in FIG. 14. The second delayed signal generator 90 generates a second delayed signal Sd2. The second delayed signal generator 90 comprises, for example, a buffer circuit 91, a resistor 92, a capacitor 93, and an AND circuit 94.

The buffer circuit 91 receives input of the mode pulse signal Smp of the mode pulse signal generator 50 shown in FIG. 1, and outputs a signal S5. The signal S5 is input to the AND circuit 94 via the resistor 92 and the capacitor 93 to generate a signal S5'.

The AND circuit 94 also receives input of the mode pulse signal Smp of the mode pulse signal generator 50 shown in FIG. 1. The AND circuit 94 performs a logical AND between the signal S5' and the mode pulse signal Smp, and outputs the second delayed signal Sd2.

The output controller 70 shown in FIG. 14 comprises, for example, OR circuits 74a and 74b and an AND circuit 75, in addition to the inverter circuit 71 and the NAND circuit 73 shown in FIG. 9.

The inverter circuit 71 receives input of the first delayed signal Sd1 of the OR circuit 64. The inverter circuit 71 inverts the first delayed signal Sd1, and outputs the signal S2.

The OR circuit 74a receives input of the signal S2 of the inverter circuit 71 and the PWM signal Spwm of the flip flop circuit 42 shown in FIG. 1. The OR circuit 74a performs a logical OR between the signal S2 and the PWM signal Spwm, and outputs a signal S6.

The OR circuit 74b receives input of the PWM signal Spwm of the flip flop circuit 42 shown in FIG. 1 and the second delayed signal Sd2 of the AND circuit 94. The OR circuit 74b performs a logical OR between the PWM signal Spwm and the second delayed signal Sd2, and outputs a signal S7.

The AND circuit 75 receives input of the signal S6 of the OR circuit 74a and the signal S7 of the OR circuit 74b. The AND circuit 75 performs a logical AND between the signal S6 and the signal S7, and outputs the first control signal Spwm1.

The first control signal Spwm1 generated in this way is a signal for controlling the primary switches in the output part 10. In detail, the first control signal Spwm1 is input to the switch 11a, which is the high-side switch of the primary switches via the level shifter 17a and the buffer circuit 14a shown in FIG. 1, as the above-mentioned drive signal Sgate1. The first control signal Spwm1 is also input to the switch 11*b*, which is the low-side switch of the primary switches via the inverter circuit 18*a* and the buffer circuit 14*b* shown in FIG. 1, as the above-mentioned drive signal Sgate2.

The NAND circuit 73 receives input of the PWM signal Spwm of the flip flop circuit 42 shown in FIG. 1 and the mode pulse signal Smp of the mode pulse signal generator 50 shown in FIG. 1. The NAND circuit 73 performs a logical NAND between the PWM signal Spwm and the mode pulse signal Smp, and outputs the second control signal Spwm2.

The second control signal Spwm2 generated in this way is a signal for controlling the secondary switches in the output part 10. In detail, the second control signal Spwm2 is input to the switch 11*c*, which is the high-side switch of the secondary switches via the inverter circuit 18*b* and the buffer circuit 14*c* shown in FIG. 1, as the above-mentioned drive signal Sgate3. The second control signal Spwm2 is also input to the switch 11*d*, which is the low-side switch of the secondary switches via the inverter circuit 18*b* and the buffer circuit 14*d* shown in FIG. 1, as the above-mentioned drive signal Sgate4.

Figure 15:
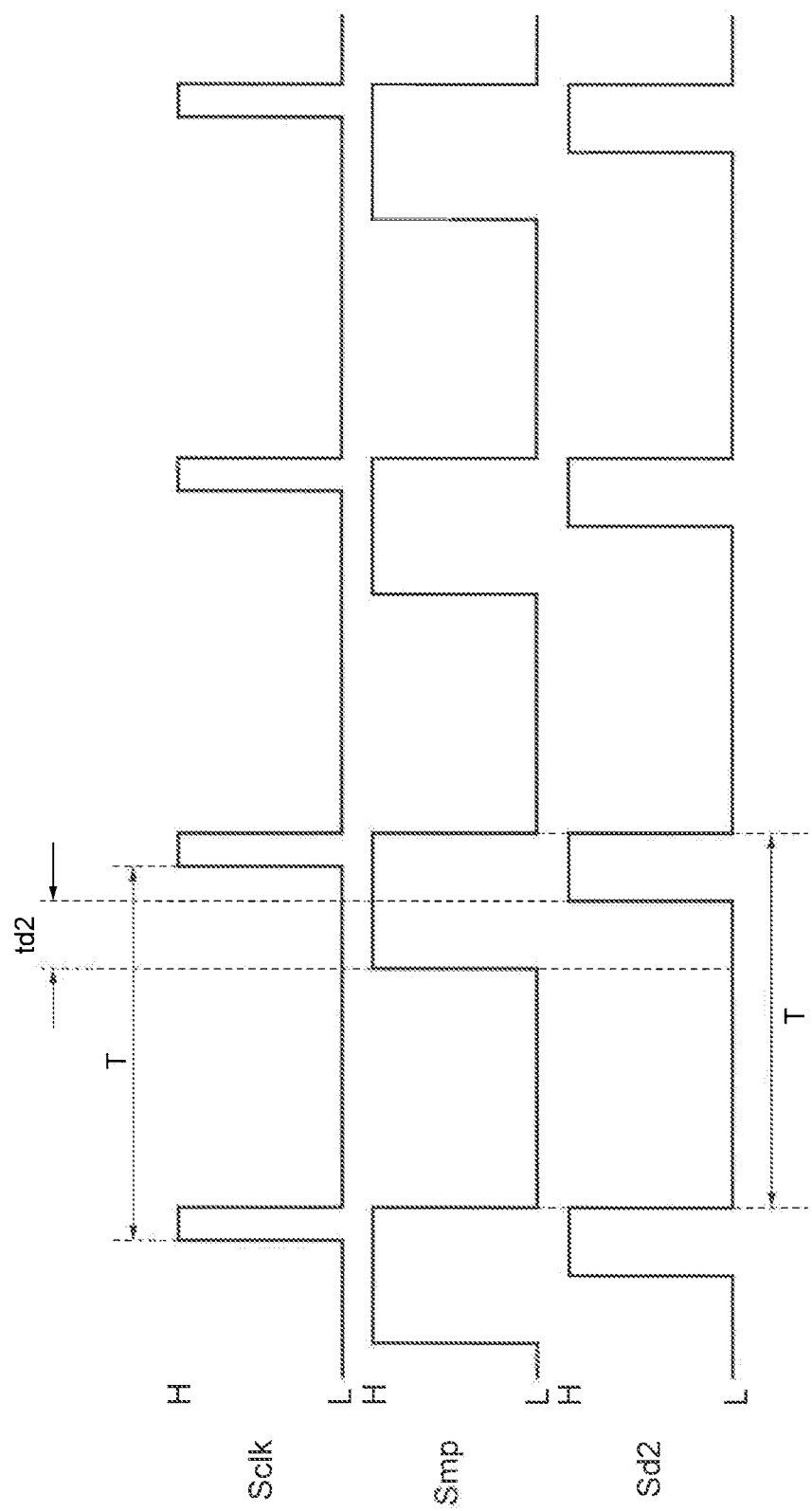
FIG. 15 is a waveform diagram describing a second delayed signal.

FIG. 15 is a waveform diagram describing the second delayed signal Sd2. As shown in FIG. 15, the second delayed signal Sd2 falls to L level in response to L level of the mode pulse signal Smp, and rises to H level with a second delay time td2 in response to H level of the mode pulse signal Smp, i.e. the rising edge of the pulse of the mode pulse signal Smp. In other words, the time period of L level of the second delayed signal Sd2 is longer than the time period of L level of the mode pulse signal Smp by the second delay time td2. The second delayed signal Sd2 has the same period as the period T of the clock signal Sclk of the oscillator OSC, as is also the case with the mode pulse signal Smp. Accordingly, the second delayed signal Sd2 has a pulse whose pulse width, i.e. the time period of H level, is shorter than the pulse width of the mode pulse signal Smp by the second delay time td2.

Although FIG. 15 shows an example of the second delayed signal Sd2 that falls to L level in response to L level of the mode pulse signal Smp and whose rising edge is delayed for the second delay time td2 from the rising edge of the pulse of the mode pulse signal Smp, this is not a limitation. As an example, the second delayed signal Sd2 may rise to H level in response to L level of the mode pulse signal Smp, and have the falling edge delayed for the second delay time td2 from the rising edge of the pulse of the mode pulse signal Smp. As another example, the second delayed signal Sd2 may rise to H level in response to H level of the mode pulse signal Smp, and have the falling edge delayed for the second delay time td2 from the rising edge of the pulse of the mode pulse signal Smp. As another example, the second delayed signal Sd2 may fall to L level in response to H level of the mode pulse signal Smp, and have the rising edge delayed for the second delay time td2 from the rising edge of the pulse of the mode pulse signal Smp. Thus, the second delayed signal Sd2 simply needs to have a pulse whose rising edge or falling edge is delayed for the second delay time td2 from the rising edge or falling edge of the pulse of the mode pulse signal Smp. The second delayed signal generator 90 shown in FIG. 14 is appropriately configured to generate the corresponding second delayed signal Sd2.

The second delay time td2 is desirably set to the same length as the first delay time td1. In the case where it is difficult to set the second delay time td2 to the same length as the first delay time td1, the second delay time td2 is desirably set to be slightly longer than the first delay time td1.

FIGS. 16 to 19 are each a waveform diagram describing the operation of the output controller 70 shown in FIG. 14. In FIGS. 16 to 19, Vgs1 denotes the level of the voltage between the gate and source of the switch 11*a* shown in FIG. 1, Vg2 denotes the level of the gate voltage of the switch 11*b* shown in FIG. 1, Vg3 denotes the level of the gate voltage of the switch 11*c* shown in FIG. 1, and Vg4 denotes the level of the gate voltage of the switch 11*d* shown in FIG. 1. The first control signal Spwm1 is generated based on the PWM signal Spwm, the first delayed signal Sd1, and the second delayed signal Sd2, and so has the same period as the period T of the clock signal Sclk, as is also the case with the other signals shown in FIGS. 16 to 19. The second control signal Spwm2 is generated based on the PWM signal Spwm and the mode pulse signal Smp, and so also has the same period as the period T of the clock signal Sclk. Therefore, the switching frequency of the output part 10 can be made equal to the frequency of the clock signal Sclk.

Figure 16:
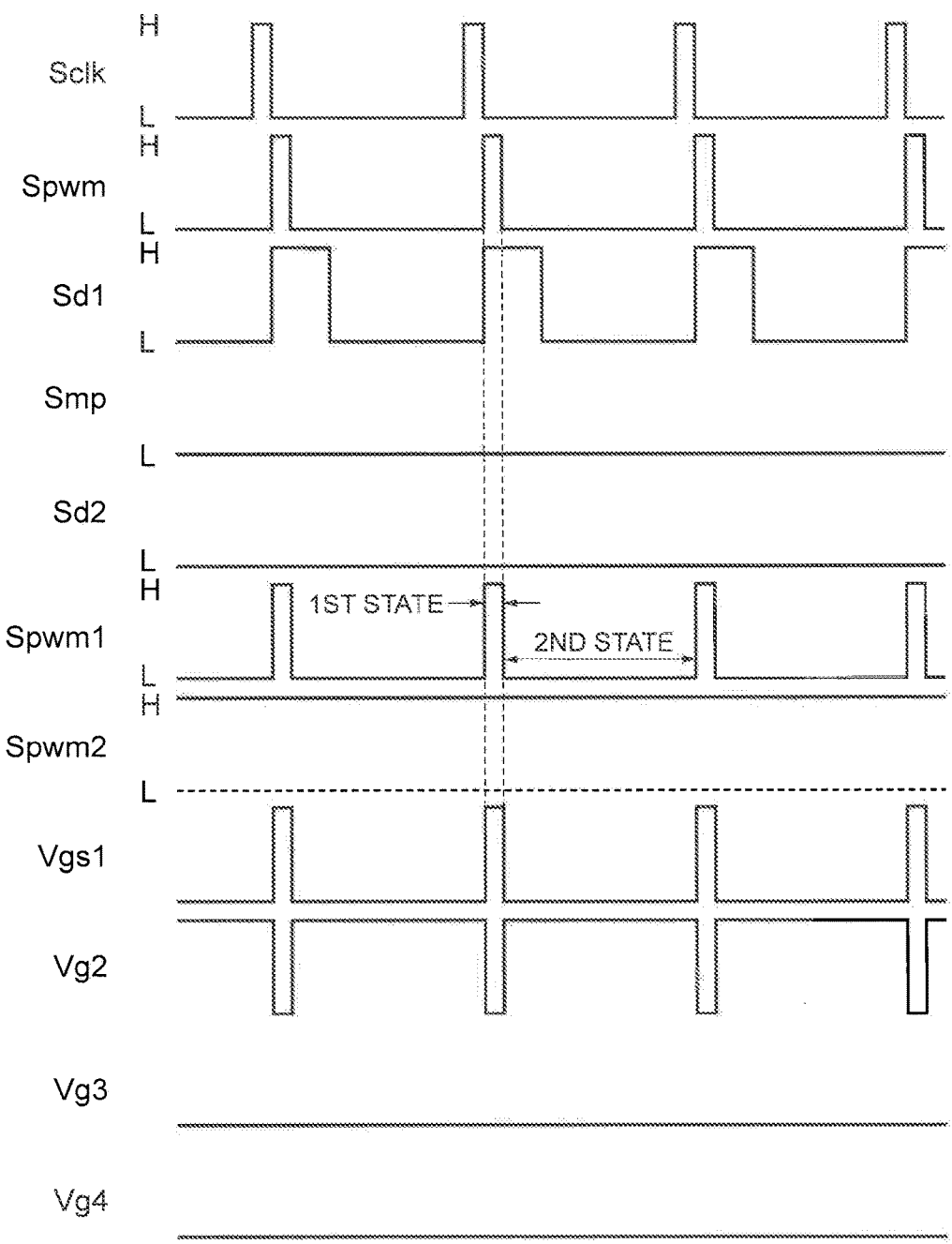
FIG. 16 is a waveform diagram describing the operation of the output controller shown in FIG. 14.
Figure 17:
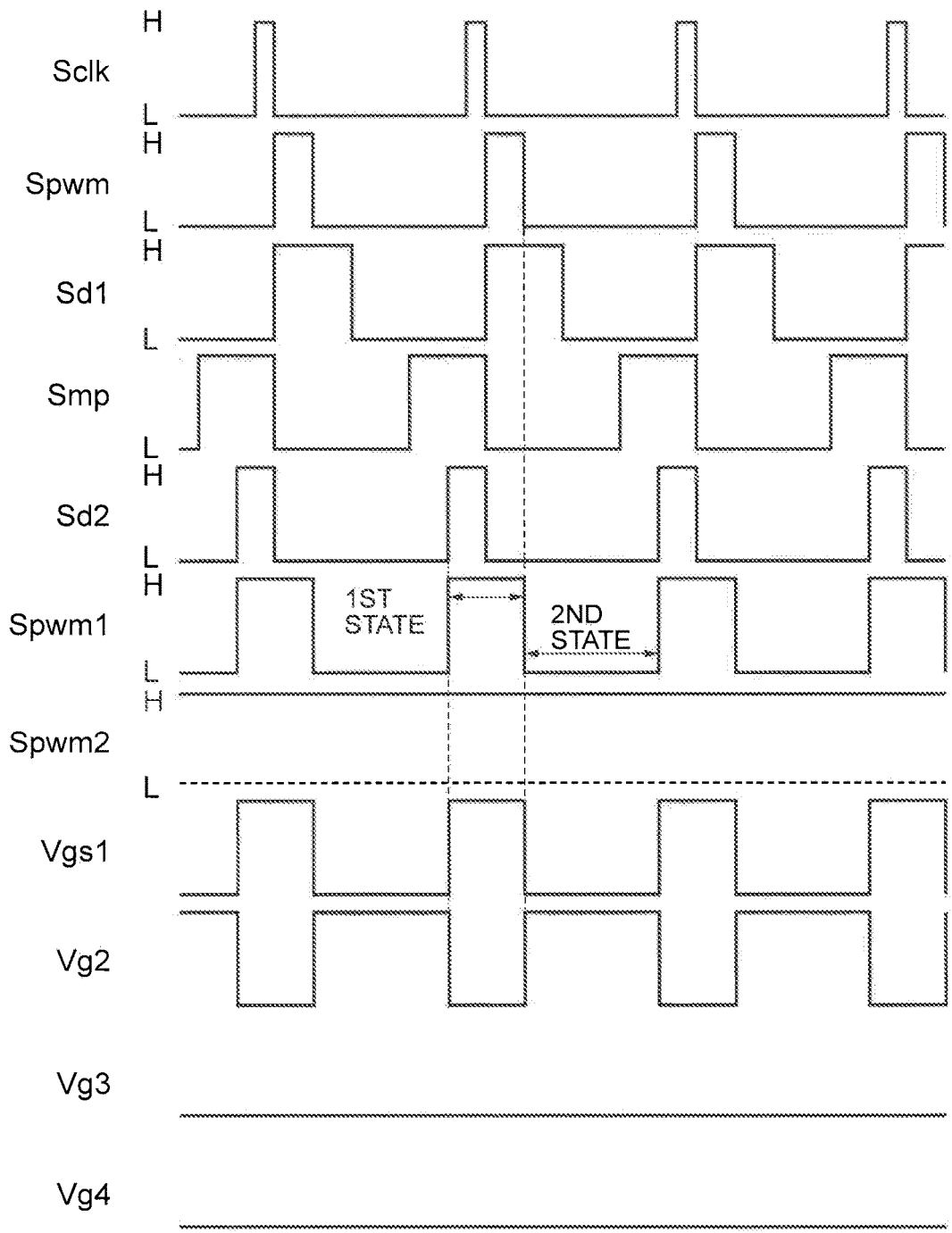
FIG. 17 is a waveform diagram describing the operation of the output controller shown in FIG. 14.
Figure 18:
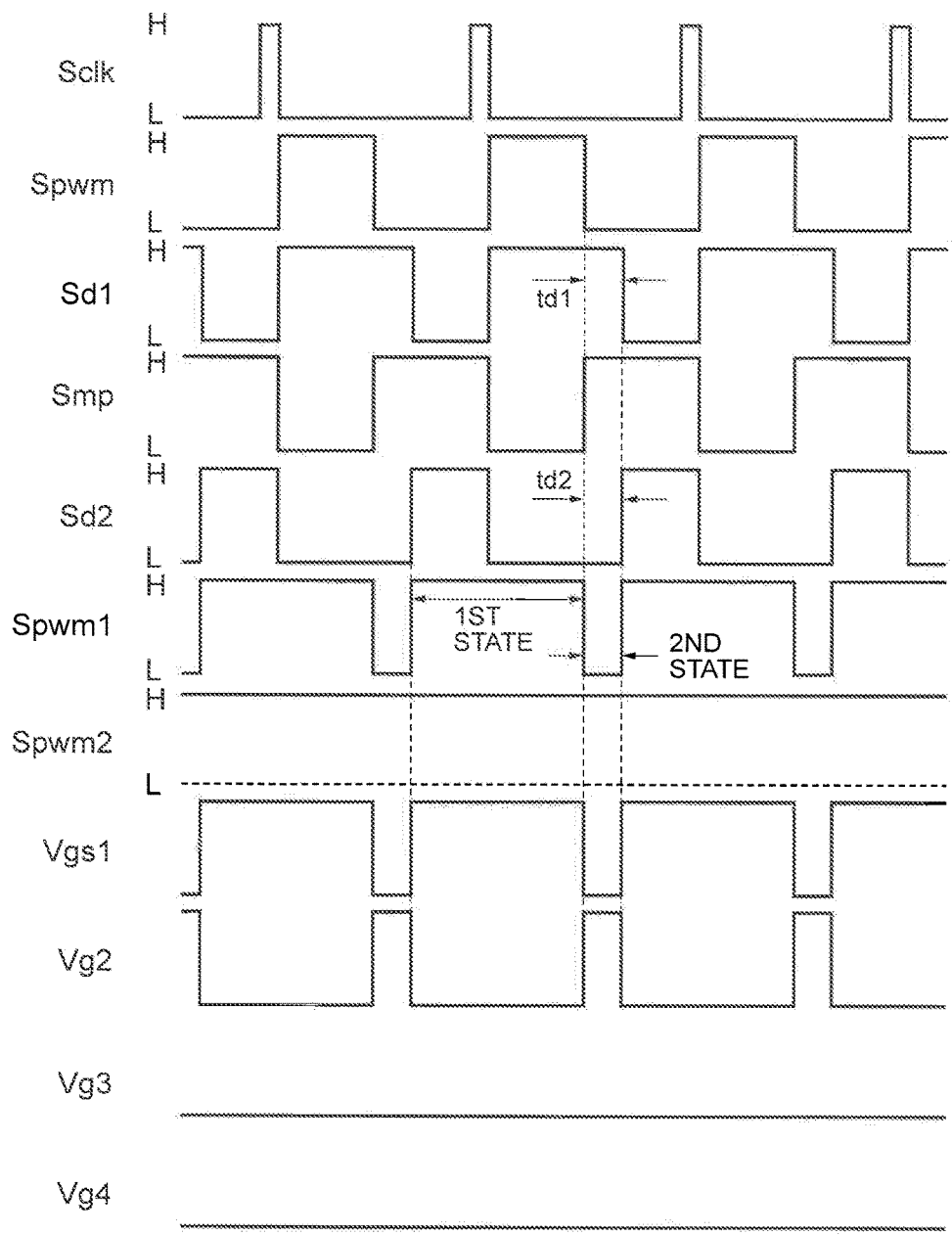
FIG. 18 is a waveform diagram describing the operation of the output controller shown in FIG. 14.

In the case where the input voltage Vin is higher than the output voltage Vout (Vin>Vout), the output controller 70 shown in FIG. 14 controls the switching of the output part 10 in the step-down mode. In detail, the output controller 70 outputs the first control signal Spwm1 and the second control signal Spwm2 so as to periodically repeat: the time period during which the first control signal Spwm1 is H level, i.e. the time period of the first state; and the time period during which the first control signal Spwm1 is L level, i.e. the time period of the second state, as shown in FIGS. 16 to 18. In the step-down mode, the second control signal Spwm2 is H level in the whole time period. FIG. 16 shows the case where the input voltage Vin is sufficiently higher than the output voltage Vout (Vin>>Vout). FIG. 17 shows the case where the input voltage Vin is higher than the output voltage Vout (Vin>Vout). FIG. 18 shows the case where the input voltage Vin is approximately equal to the output voltage Vout (Vin~Vout). When the difference between the input voltage Vin and the output voltage Vout is smaller, the first control signal Spwm1 has a longer time period of the first state and a shorter time period of the second state, as shown in FIGS. 16 to 18.

When the input voltage Vin is approximately equal to the output voltage Vout, the time period of the second state is shortest, and the time period of L level of the first control signal Spwm1 is equal to the first delay time td1, as shown in FIG. 18.

Here, the first delay time td1 of the first delayed signal Sd1 overlaps the second delay time td2 of the second delayed signal Sd2. Therefore, setting the second delay time td2 longer than or equal to the first delay time td1 can cancel the blank time period tb shown in FIG. 13 which occurs in the PWM signal Spwm and affects the first control signal Spwm1 and the second control signal Spwm2.

Figure 19:
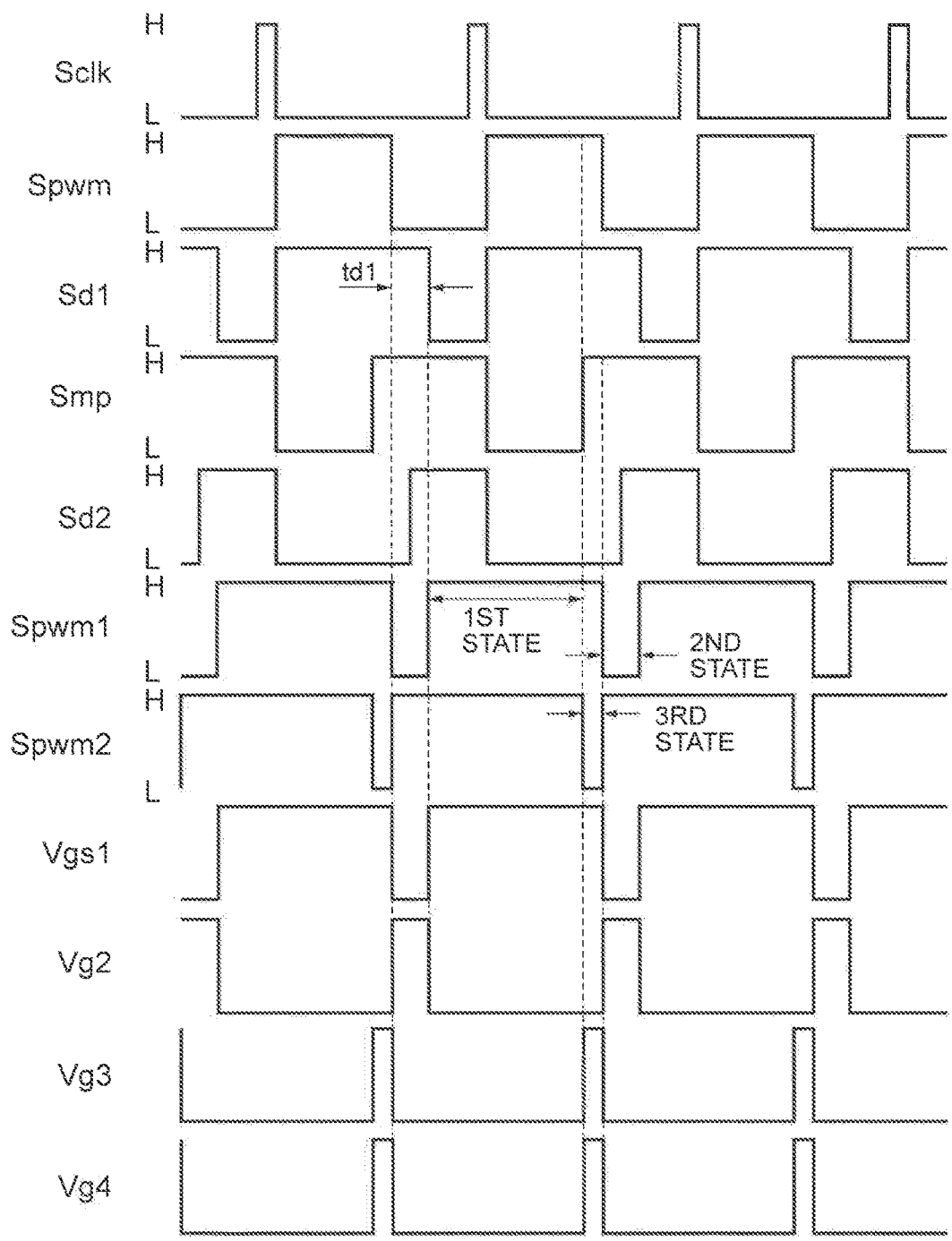
FIG. 19 is a waveform diagram describing the operation of the output controller shown in FIG. 14.

In the case where the input voltage Vin is lower than the output voltage Vout (Vin<Vout), the output controller 70 shown in FIG. 14 controls the switching of the output part 10 in the step-up mode. In detail, the output controller 70 outputs the first control signal Spwm1 and the second control signal Spwm2 so as to periodically repeat: the time period during which the first control signal Spwm1 is H level and the second control signal Spwm2 is H level, i.e. the time period of the first state; the time period during which the first control signal Spwm1 is H level and the second control signal Spwm2 is L level, i.e. the time period of the third state; and the time period during which the first control signal Spwm1 is L level and the second control signal Spwm2 is H level, i.e. the time period of the second state, as shown in FIG. 19. In the step-up mode, energy is stored in the inductor 15 in the third state, making it possible to step up the input voltage Vin to the output voltage Vout. Accordingly, when the difference between the output voltage Vout and the input voltage Vin is larger, the second control signal Spwm2 has a longer time period of L level, that is, the time period of the first state is shorter and the time period of the third state is longer, although not shown.

In the step-up mode, the time period of L level of the first control signal Spwm1 is fixed at the first delay time td1, as shown in FIG. 19. The time period of the second state is thus longer than or equal to the first delay time td1. Therefore, setting the first delay time td1 based on the boost capacitor 12a can ensure the charge time for the boost capacitor 12a in each cycle of the step-down mode and the step-up mode.

As shown in FIGS. 18 and 19, when switching from the step-down mode to the step-up mode, the output controller 70 changes part of the time period of H level of the second control signal Spwm2 to L level, to create the third state between the first state and the second state. When switching from the step-up mode to the step-down mode, the output controller 70 changes the time period of L level of the second control signal Spwm2 to H level, to remove the third state between the first state and the second state. Therefore, the output part 10 can be seamlessly switched from the step-down mode to the step-up mode or from the step-up mode to the step-down mode.

Although FIGS. 14 to 19 show an example where the output controller 70 controls the output part 10 so that the time period of the second state is longer than or equal to the first delay time td1 and the first state, the third state, and the second state in this order form one cycle in the step-up mode, this is not a limitation. The output controller 70 may control the output part 10 so that the time period of the second state is longer than or equal to the second delay time td2 and the first state, the second state, and the third state subsequently form one cycle in the step-up mode.

Figure 20:
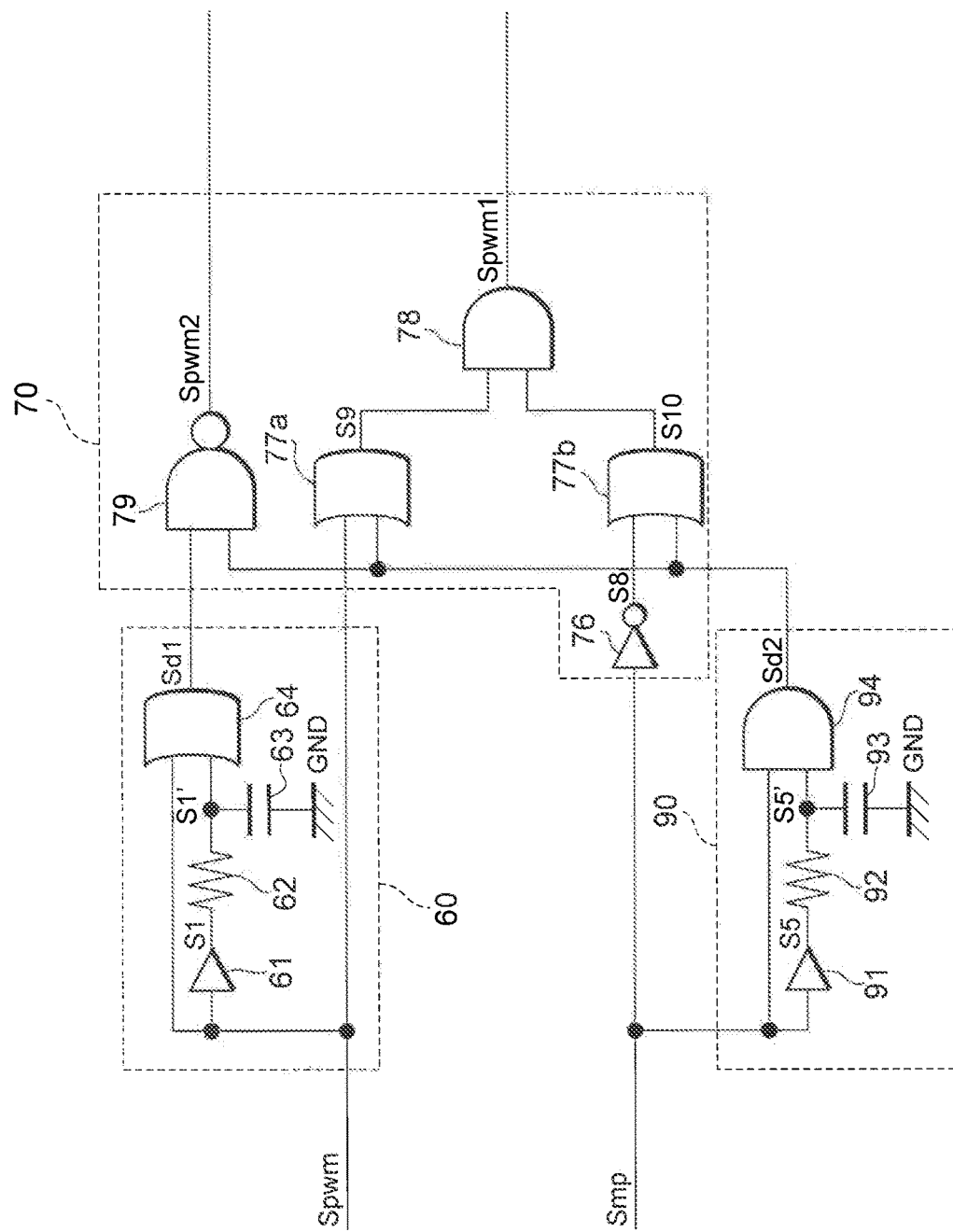
FIG. 20 is a circuit diagram showing a third example of the output controller, according to a first embodiment.

FIG. 20 is a circuit diagram showing a third example of the output controller 70 in the first embodiment. The first delayed signal generator 60 and the second delayed signal generator 90 are the same as those in FIG. 14, and so their description is omitted. The output controller 70 comprises, for example, an inverter circuit 76, OR circuits 77a and 77b, an AND circuit 78, and a NAND circuit 79.

The inverter circuit 76 receives input of the mode pulse signal Smp of the mode pulse signal generator 50 shown in FIG. 1. The inverter circuit 76 inverts the mode pulse signal Smp, and outputs a signal S8.

The OR circuit 77a receives input of the PWM signal Spwm of the flip flop circuit 42 shown in FIG. 1 and the second delayed signal Sd2 of the AND circuit 94. The OR circuit 77a performs a logical OR between the PWM signal Spwm and the second delayed signal Sd2, and outputs a signal S9.

The OR circuit 77b receives input of the signal S8 of the inverter circuit 76 and the second delayed signal Sd2 of the AND circuit 94. The OR circuit 77b performs a logical OR between the signal S8 and the second delayed signal Sd2, and outputs a signal S10.

The AND circuit 78 receives input of the signal S9 of the OR circuit 77a and the signal S10 of the OR circuit 77b. The AND circuit 78 performs a logical AND between the signal S9 and the signal S10, and outputs the first control signal Spwm1.

The first control signal Spwm1 generated in this way is a signal for controlling the primary switches in the output part 10. In detail, the first control signal Spwm1 is input to the switch 11a, which is the high-side switch of the primary switches via the level shifter 17a and the buffer circuit 14a shown in FIG. 1, as the above-mentioned drive signal Sgate1. The first control signal Spwm1 is also input to the switch 11b, which is the low-side switch of the primary switches via the inverter circuit 18a and the buffer circuit 14b shown in FIG. 1, as the above-mentioned drive signal Sgate2.

The NAND circuit 79 receives input of the first delayed signal Sd1 of the OR circuit 64 and the second delayed signal Sd2 of the AND circuit 94. The NAND circuit 79 performs a logical NAND between the first delayed signal Sd1 and the second delayed signal Sd2, and outputs the second control signal Spwm2.

The second control signal Spwm2 generated in this way is a signal for controlling the secondary switches in the output part 10. In detail, the second control signal Spwm2 is input to the switch 11c, which is the high-side switch of the secondary switches via the inverter circuit 18b and the buffer circuit 14c shown in FIG. 1, as the above-mentioned drive signal Sgate3. The second control signal Spwm2 is also input to the switch 11d, which is the low-side switch of the secondary switches via the inverter circuit 18b and the buffer circuit 14d shown in FIG. 1, as the above-mentioned drive signal Sgate4.

In the third example of the output controller 70 shown in FIG. 20, the second delay time td2 is set based on the boost capacitor 12a shown in FIG. 1. For example, the resistance of the resistor 92 and the capacitance of the capacitor 93 shown in FIG. 20 are set based on the capacitance of the boost capacitor 12a and the like. Therefore, the second delay time td2 can be set to the same length as the time necessary for charging the boost capacitor 12a.

The first delay time td1 is desirably set to the same length as the second delay time td2. In the case where it is difficult to set the first delay time td1 to the same length as the second delay time td2, the first delay time td1 is desirably set to be slightly longer than the second delay time td2.

FIGS. 21 to 24 are each a waveform diagram describing the operation of the output controller 70 shown in FIG. 20. In FIGS. 21 to 24, Vgs1 denotes the level of the voltage between the gate and source of the switch 11a shown in FIG. 1, Vg2 denotes the level of the gate voltage of the switch 11b shown in FIG. 1, Vg3 denotes the level of the gate voltage of the switch 11c shown in FIG. 1, and Vg4 denotes the level of the gate voltage of the switch 11d shown in FIG. 1. The first control signal Spwm1 is generated based on the PWM signal Spwm, the mode pulse signal Smp, and the first delayed signal Sd1, and so has the same period as the period T of the clock signal Sclk as is also the case with the other signals shown in FIGS. 21 to 24. The second control signal Spwm2 is generated based on the first delayed signal Sd1 and the second delayed signal Sd2, and so also has the same period as the period T of the clock signal Sclk. Therefore, the switching frequency of the output part 10 can be made equal to the frequency of the clock signal Sclk.

Figure 21:
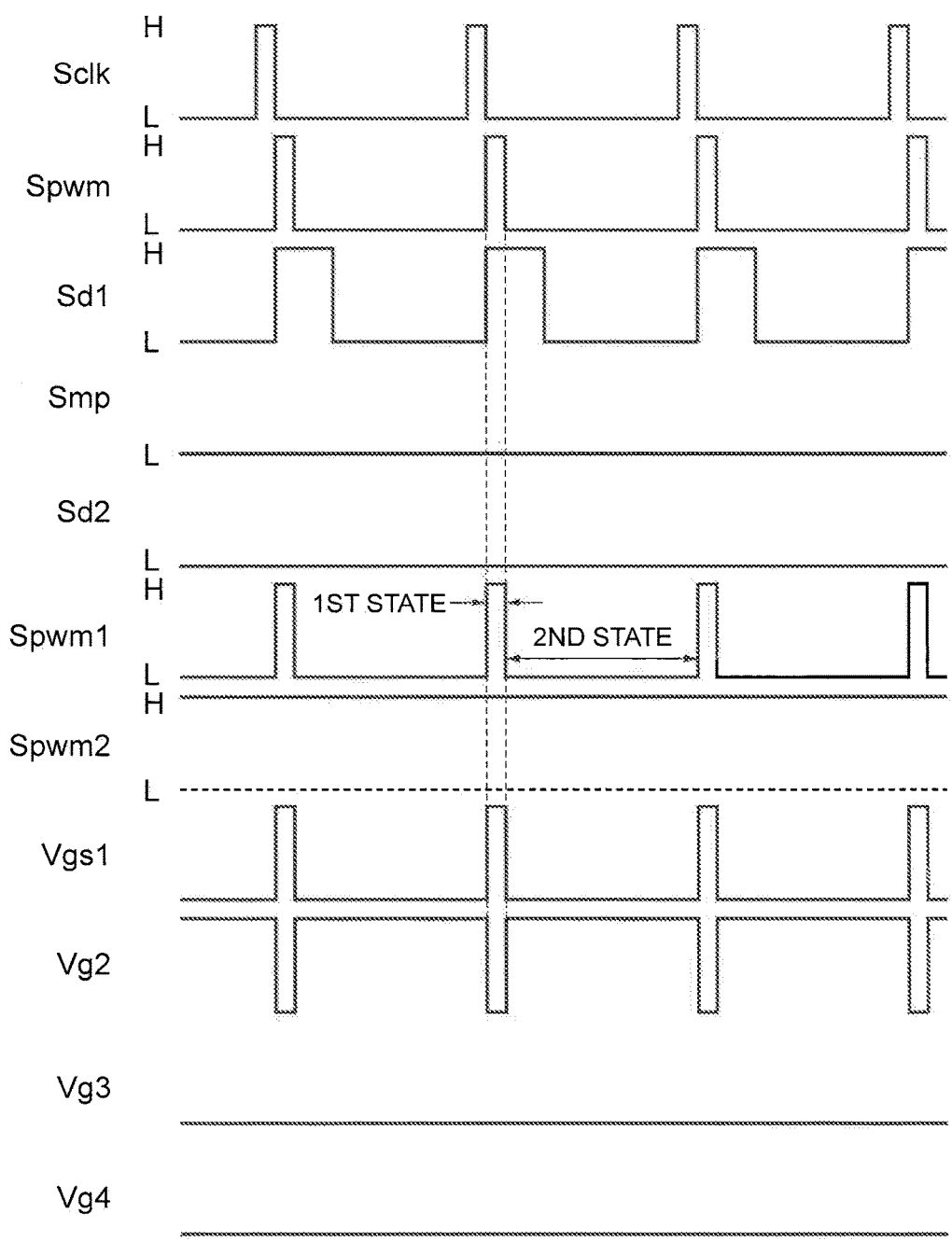
FIG. 21 is a waveform diagram describing the operation of the output controller shown in FIG. 20.
Figure 22:
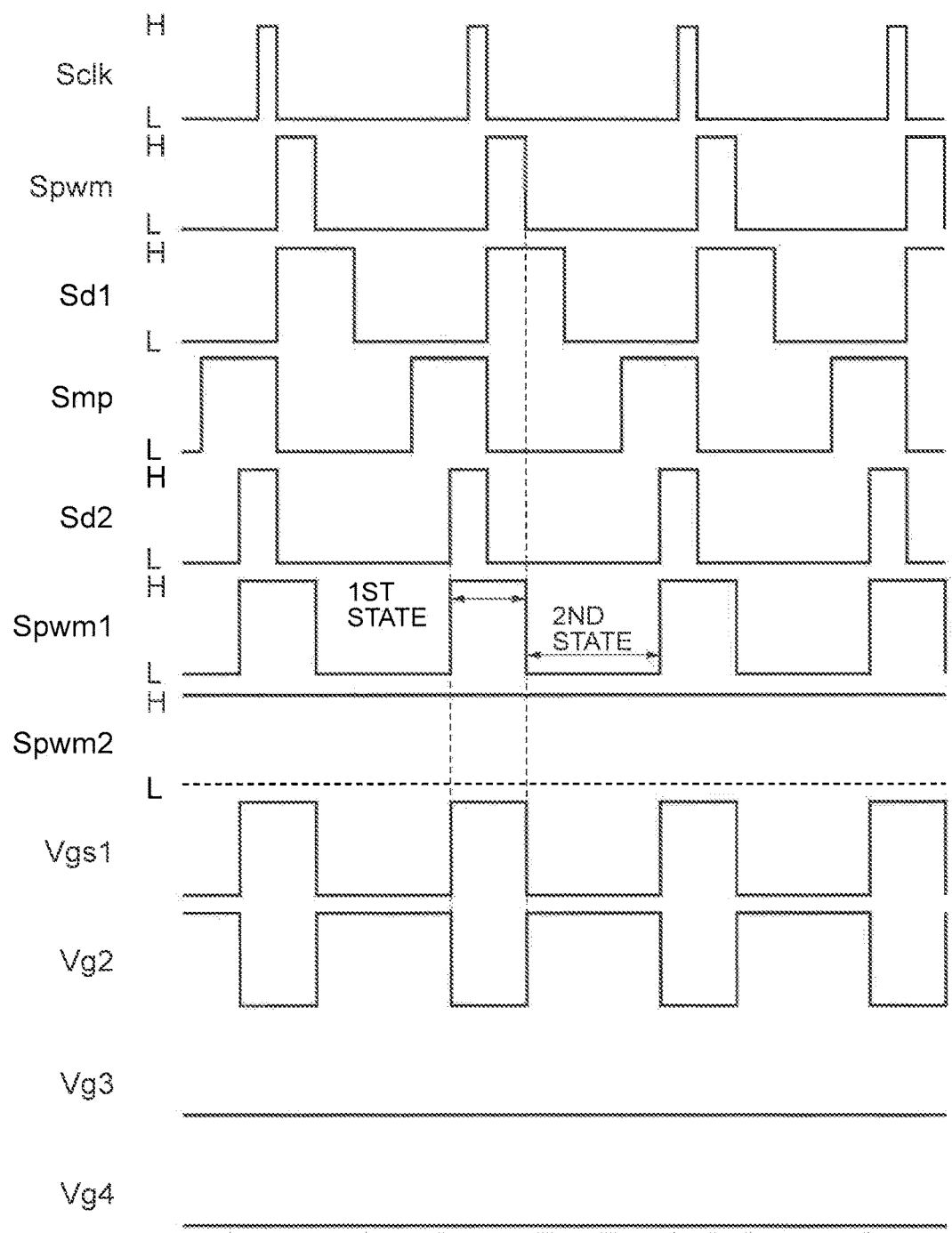
FIG. 22 is a waveform diagram describing the operation of the output controller shown in FIG. 20.
Figure 23:
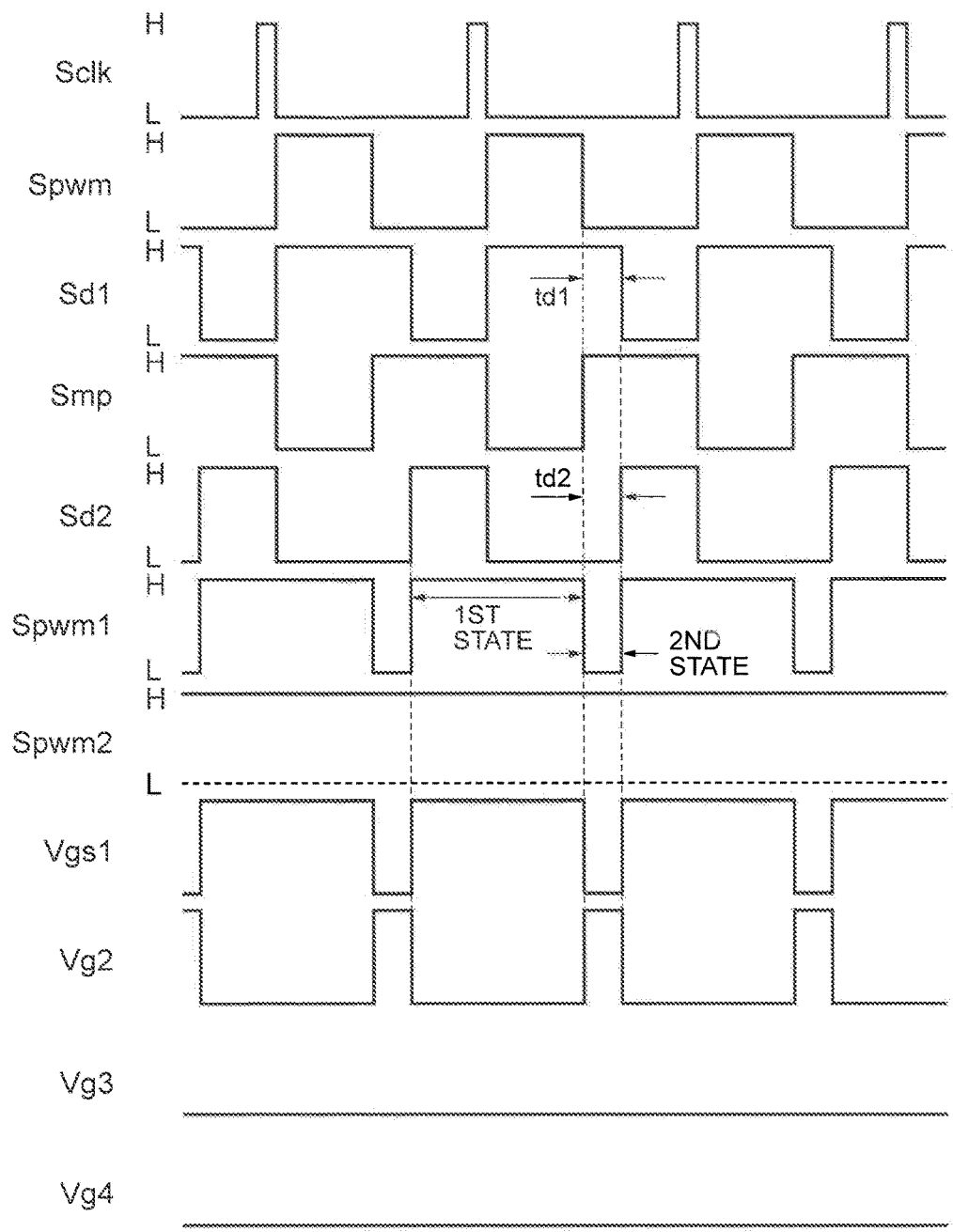
FIG. 23 is a waveform diagram describing the operation of the output controller shown in FIG. 20.

In the case where the input voltage Vin is higher than the output voltage Vout (Vin>Vout), the output controller 70 shown in FIG. 20 controls the switching of the output part 10 in the step-down mode. In detail, the output controller 70 outputs the first control signal Spwm1 and the second control signal Spwm2 so as to periodically repeat: the time period during which the first control signal Spwm1 is H level, i.e. the time period of the first state; and the time period during which the first control signal Spwm1 is L level, i.e. the time period of the second state, as shown in FIGS. 21 to 23. In the step-down mode, the second control signal Spwm2 is H level in the whole time period. FIG. 21 shows the case where the input voltage Vin is sufficiently higher than the output voltage Vout (Vin>>Vout). FIG. 22 shows the case where the input voltage Vin is higher than the output voltage Vout (Vin>Vout). FIG. 23 shows the case where the input voltage Vin is approximately equal to the output voltage Vout (Vin Vout). When the difference between the input voltage Vin and the output voltage Vout is smaller, the first control signal Spwm1 has a longer time period of the first state and a shorter time period of the second state, as shown in FIGS. 21 to 23.

When the input voltage Vin is approximately equal to the output voltage Vout, the time period of the second state is shortest, and the time period of L level of the first control signal Spwm1 is equal to the second delay time td2, as shown in FIG. 23.

Here, the second delay time td2 of the second delayed signal Sd2 overlaps the first delay time td1 of the first delayed signal Sd1. Therefore, setting the first delay time td1 longer than or equal to the second delay time td2 can cancel the blank time period tb shown in FIG. 13 which occurs in the PWM signal Spwm and affects the first control signal Spwm1 and the second control signal Spwm2.

Figure 24:
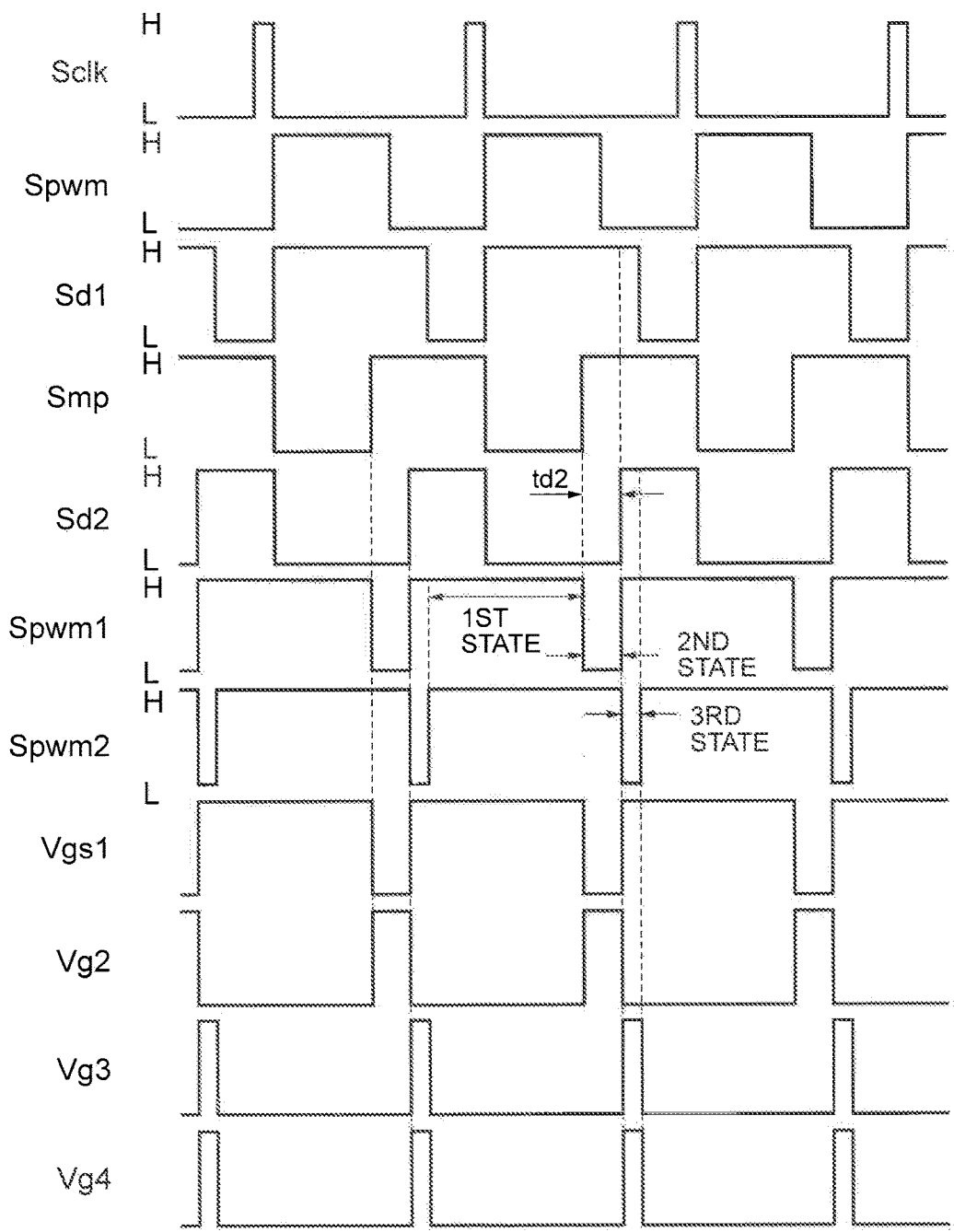
FIG. 24 is a waveform diagram describing the operation of the output controller shown in FIG. 20.

In the case where the input voltage Vin is lower than the output voltage Vout (Vin<Vout), the output controller 70 shown in FIG. 20 controls the switching of the output part 10 in the step-up mode. In detail, the output controller 70 outputs the first control signal Spwm1 and the second control signal Spwm2 so as to periodically repeat: the time period during which the first control signal Spwm1 is H level and the second control signal Spwm2 is H level, i.e. the time period of the first state; the time period during which the first control signal Spwm1 is L level and the second control signal Spwm2 is H level, i.e. the time period of the second state; and the time period during which the first control signal Spwm1 is H level and the second control signal Spwm2 is L level, i.e. the time period of the third state, as shown in FIG. 24. In the step-up mode, energy is stored in the inductor 15 in the third state, making it possible to step up the input voltage Vin to the output voltage Vout. Hence, when the difference between the output voltage Vout and the input voltage Vin is larger, the second control signal Spwm2 has a longer time period of L level, that is, the time period of the first state is shorter and the time period of the third state is longer, although not shown.

In the step-up mode, the time period of L level of the first control signal Spwm1 is fixed at the second delay time td2, as shown in FIG. 24. The time period of the second state is thus longer than or equal to the second delay time td2. Therefore, setting the second delay time td2 based on the boost capacitor 12a can ensure the charge time for the boost capacitor 12a in each cycle of the step-down mode and the step-up mode.

When switching from the step-down mode to the step-up mode, the output controller 70 changes part of the time period of H level of the second control signal Spwm2 to L level, to create the third state between the second state and the first state, as shown in FIGS. 23 and 24. When switching from the step-up mode to the step-down mode, the output controller 70 changes the time period of L level of the second control signal Spwm2 to H level, to remove the third state between the second state and the first state. Therefore, the output part 10 can be seamlessly switched from the step-down mode to the step-up mode or from the step-up mode to the step-down mode.

Thus, in the control apparatus 20, the switching power supply 100, and the control method in this embodiment, the output controller 70 controls the output part 10 based on at least the PWM signal Spwm, the mode pulse signal Smp, and the first delayed signal Sd1. Therefore, the switching frequency of the output part 10 can be made equal to the frequency of the clock signal Sclk. The output controller 70 also controls the switching of the output part 10 so that the time period during which the switch 11a, which is the high-side switch of the primary switches is off and the switch 11b, which is the low-side switch of the primary switches is on is longer than or equal to the first delay time td1. The time period of the second state is thus longer than or equal to the first delay time td1. Therefore, setting the first delay time td1 based on the boost capacitor 12a can ensure the charge time for the boost capacitor 12a in each cycle of the step-down mode and the step-up mode. Accordingly, this enables control of the output part 10 comprising two primary switches which are N-type transistors, without changing the switching frequency.

In the control apparatus 20, the switching power supply 100, and the control method in this embodiment, the output controller 70 controls the output part 10 based on at least the PWM signal Spwm, the mode pulse signal Smp, the first delayed signal Sd1, and the second delayed signal Sd2. Setting the second delay time td2 longer than or equal to the first delay time td1 or setting the first delay time td1 longer than or equal to the second delay time td2 can cancel the blank time period tb shown in FIG. 13 which occurs in the PWM signal Spwm and affects the first control signal Spwm1 and the second control signal Spwm2. Moreover, the output part 10 can be seamlessly switched from the step-down mode to the step-up mode or from the step-up mode to the step-down mode.

In the control apparatus 20, the switching power supply 100, and the control method in this embodiment, the output controller 70 controls the switching of the output part 10 so that the time period of the second state is longer than or equal to the first delay time td1 or the second delay time td2. Therefore, setting the one of the first delay time td1 and the second delay time td2 based on the boost capacitor 12a can ensure the charge time for the boost capacitor 12a in each cycle of the step-down mode and the step-up mode.

Second Embodiment

FIGS. 25 to 31 are diagrams describing a second embodiment. The same components as those in the first embodiment described above are given the same symbols, and their description is omitted according to need, unless stated otherwise. Similar components to those in the first embodiment described above are given similar symbols, and their detailed description is omitted according to need. Components and operations not shown are assumed to be the same as those in the first embodiment described above.

Figure 25:
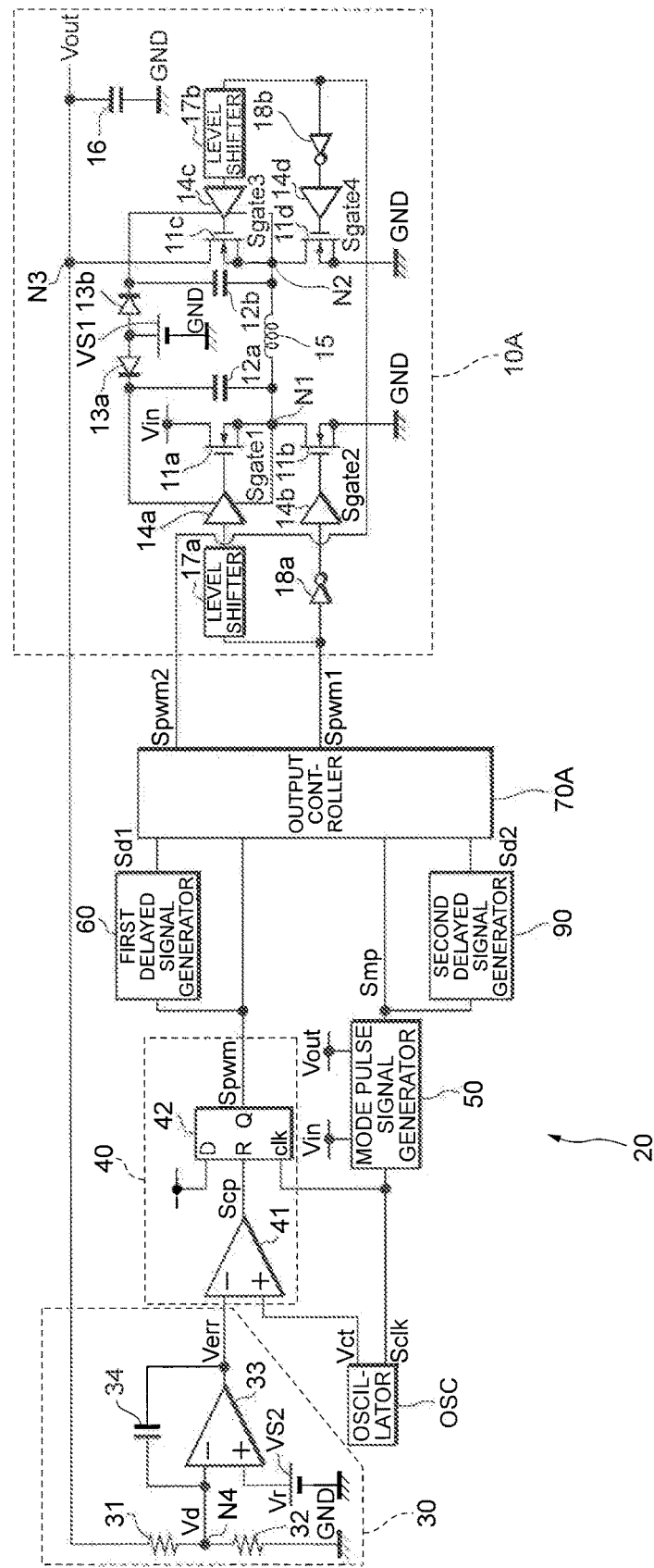
FIG. 25 is a circuit diagram showing an example of a buck-boost power supply, according to a second embodiment.

FIG. 25 is a circuit diagram showing an example of a buck-boost power supply 100A in the second embodiment. For example, the buck-boost power supply 100A is an H-bridge DC-to-DC converter that steps up or steps down an input voltage Vin to generate an output voltage Vout. The buck-boost power supply 100A comprises an output part 10A and a control apparatus 20, as shown in FIG. 25.

The output part 10A comprises the switches 11a to 11d, boost capacitors 12a and 12b, boost diodes 13a and 13b, the buffer circuits 14a to 14d, the inductor 15, the smoothing capacitor 16, level shifters 17a and 17b, and the inverter circuits 18a and 18b.

The switch 11c is the high-side switch of the secondary switches, and the switch 11d is the low-side switch of the secondary switches. The switch 11c is not a P-channel MOSFET, but an N-channel MOSFET. The switch 11c has a drain connected to the node N3, and a source connected to the node N2. The switch 11d is, for example, an N-channel MOSFET as in the first embodiment. Thus, the switches 11a to 11d in the output part 10A are all N-channel MOSFETs.

The switch 11c, which is the high-side switch of the secondary switches is an N-channel MOSFET, and so is turned on when the charge (electrical energy) stored in the boost capacitor 12b is supplied to the gate of the switch 11c via the buffer circuit 14c, as with the switch 11a, which is the high-side switch of the primary switches. Thus, the charge in the boost capacitor 12b is used to turn on the switch 11c. To turn on the switch 11c again, the boost capacitor 12b needs to be charged.

When the switch 11c is off and the switch 11d is on, the voltage of the voltage source VS1 is applied to the boost capacitor 12b via the boost diode 13b. Thus, the boost capacitor 12b is charged while the switch 11c is off and the switch 11d is on. Thus, the output part 10A in which the secondary switches are both N-channel transistors needs to have an opportunity to charge the boost capacitor 12b each time the secondary switches are switched between on and off.

The control apparatus 20 comprises the error amplifier 30, the PWM signal generator 40, the mode pulse signal generator 50, the first delayed signal generator 60, an output controller 70A, and the second delayed signal generator 90.

Figure 26:
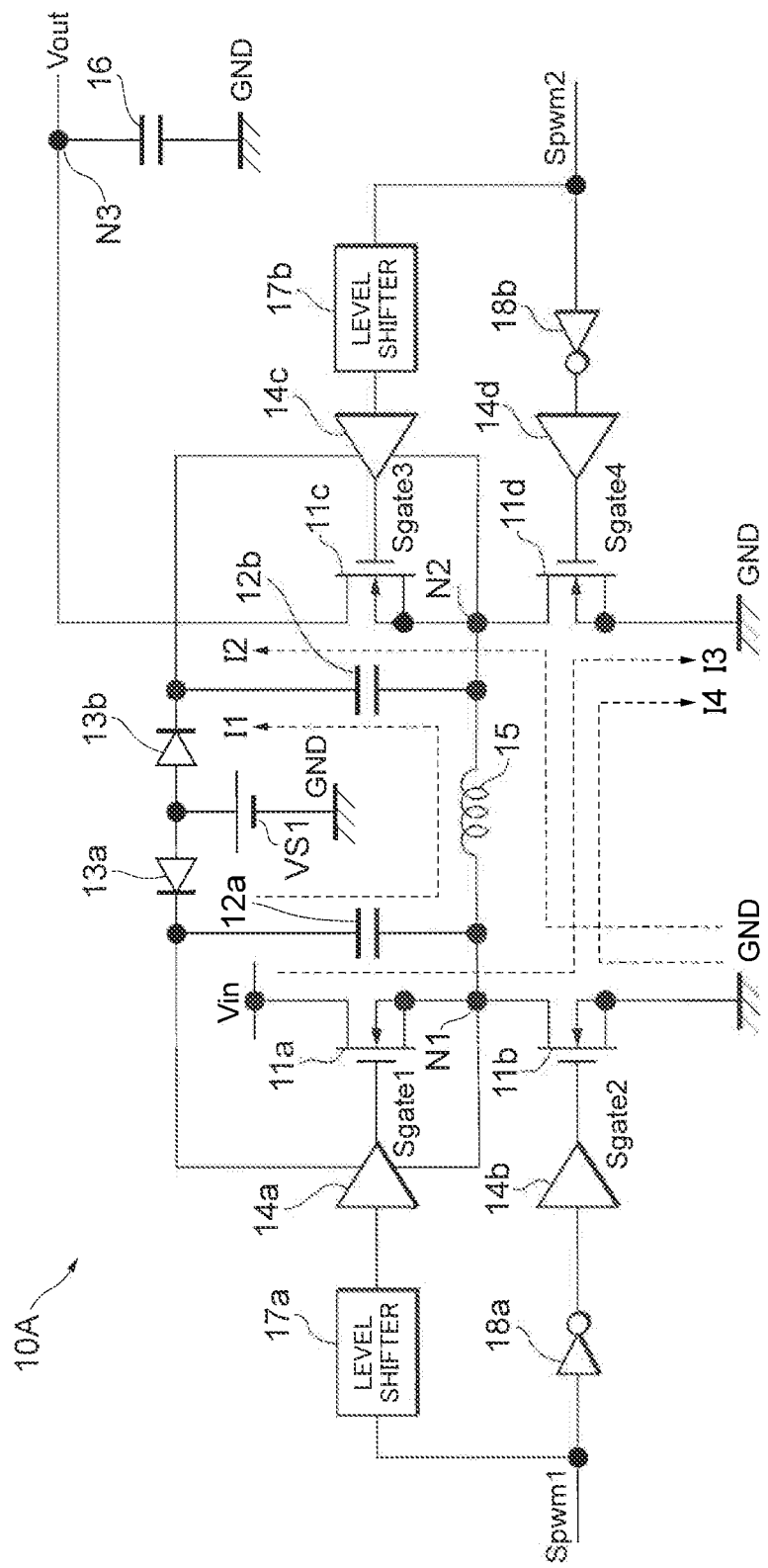
FIG. 26 is a circuit diagram describing the operation of an output part, according to a second embodiment.

FIG. 26 is a circuit diagram describing the operation of the output part 10A in the second embodiment. The output part 10A is controlled in four states, namely, the above-mentioned first, second, and third states and a fourth state, by the drive signals Sgate1 to Sgate4.

In the fourth state, the switches 11b and 11d are on, and the switches 11a and 11c are off. In this case, a current I4 flows in the output part 10A.

The output part 10A is switched between two modes: a buck or step-down mode (Vin>Vout) of stepping down the input voltage Vin to the output voltage Vout; and a boost or step-up mode (Vin<Vout) of stepping up the input voltage Vin to the output voltage Vout, based on the relation between the input voltage Vin and the output voltage Vout.

In the step-down mode, in the case where the difference between the input voltage Vin and the output voltage Vout is large, the output part 10A operates in cycles each of which is made up of the first state, the second state, and the fourth state in this order. In the case where the input voltage Vin is approximately equal to the output voltage Vout (Vin~Vout) and the difference between the input voltage Vin and the output voltage Vout is small, the output part 10A operates in cycles each of which is made up of the first state and the fourth state in this order.

In the step-up mode, the output part 10A needs to perform switching for the third state to store energy in the inductor 15, in order to step up the input voltage Vin to the output voltage Vout. In the case where the output voltage Vout is approximately equal to the input voltage Vin (Vout~Vin) and the difference between the output voltage Vout and the input voltage Vin is small, the output part 10A operates in cycles each of which is made up of the first state, the third state, the fourth state, and the second state in this order. In the case where the difference between the output voltage Vout and the input voltage Vin is large, the output part 10A operates in cycles each of which is made up of the first state, the third state, and the second state in this order.

In both of the step-down mode and the step-up mode, each cycle includes at least one of the second state and the fourth state. In the second state and the fourth state, the switch 11a is off and the switch 11b is on, so that the boost capacitor 12a is charged by the voltage source VS1 and the boost diode 13a. Namely, the second state and the fourth state are also the charge time for the boost capacitor 12a. Each of the time period of the second state, the time period of the fourth state, and the total time period of the second state and the fourth state therefore needs to be longer than or equal to the time necessary for charging the boost capacitor 12a. Each of the time period of the second state, the time period of the fourth state, and the total time period of the second state and the fourth state corresponds to an example of "first time period."

In both of the step-down mode and the step-up mode, each cycle includes at least one of the third state and the fourth state. In the third state and the fourth state, the switch 11c is off and the switch 11d is on, so that the boost capacitor 12b is charged by the voltage source VS1 and the boost diode 13b. Namely, the third state and the fourth state are also the charge time for the boost capacitor 12b. Each of the time period of the third state, the time period of the fourth state, and the total time period of the third state and the fourth state therefore needs to be longer than or equal to the time necessary for charging the boost capacitor 12b. Each of the time period of the third state, the time period of the fourth state, and the total time period of the third state and the fourth state corresponds to an example of "second time period."

Figure 27:
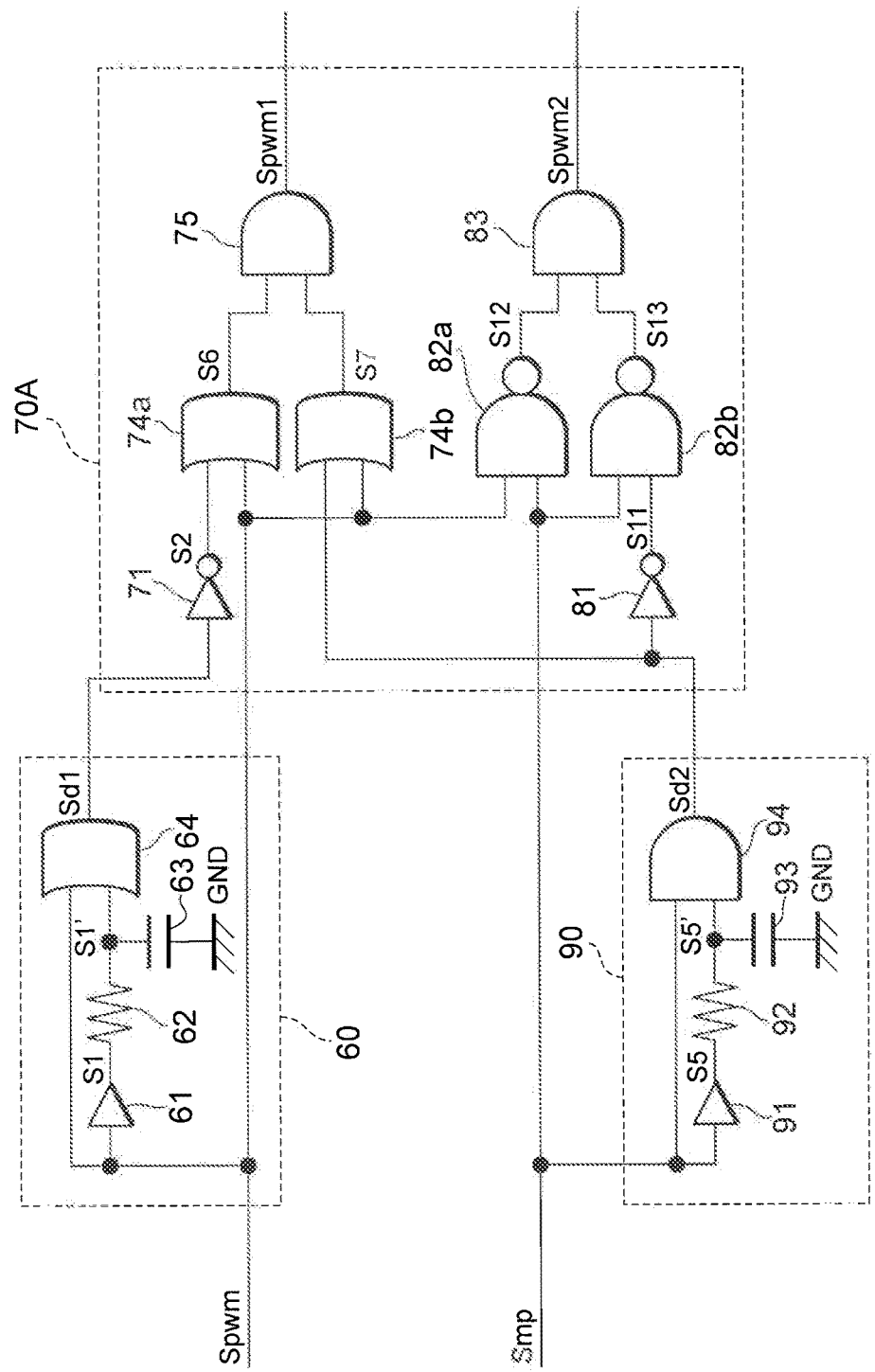
FIG. 27 is a circuit diagram showing an example of an output controller, according to a second embodiment.

FIG. 27 is a circuit diagram showing an example of the output controller 70A in the second embodiment. Although FIG. 27 also shows the above-mentioned first delayed signal generator 60 and second delayed signal generator 90, the first delayed signal generator 60 and the second delayed signal generator 90 are the same as those in the first embodiment. The output controller 70A comprises an inverter circuit 81, NAND circuits 82a and 82b, and an AND circuit 83 in addition to the inverter circuit 71, the OR circuits 74a and 74b, and the AND circuit 75 shown in FIG. 14.

The inverter circuit 71, the OR circuits 74a and 74b, and the AND circuit 75 generate the first control signal Spwm1 based on the PWM signal Spwm of the flip flop circuit 42 shown in FIG. 25, the first delayed signal Sd1 of the OR circuit 64, and the second delayed signal Sd2 of the AND circuit 94, as mentioned earlier.

The first control signal Spwm1 generated in this way is a signal for controlling the primary switches in the output part 10A. In detail, the first control signal Spwm1 is input to the switch 11a, which is the high-side switch of the primary switches via the level shifter 17a and the buffer circuit 14a shown in FIG. 25, as the above-mentioned drive signal Sgate1. The first control signal Spwm1 is also input to the switch 11b, which is the low-side switch of the primary switches via the inverter circuit 18a and the buffer circuit 14b shown in FIG. 25, as the above-mentioned drive signal Sgate2.

The inverter circuit 81 receives input of the second delayed signal Sd2 of the AND circuit 94. The inverter circuit 81 inverts the second delayed signal Sd2, and outputs a signal S11.

The NAND circuit 82a receives input of the PWM signal Spwm of the flip flop circuit 42 shown in FIG. 25 and the mode pulse signal Smp of the mode pulse signal generator 50 shown in FIG. 25. The NAND circuit 82a performs a logical NAND between the PWM signal Spwm and the mode pulse signal Smp, and outputs a signal S12.

The NAND circuit 82b receives input of the mode pulse signal Smp of the mode pulse signal generator 50 shown in FIG. 25 and the signal S11 of the inverter circuit 81. The NAND circuit 82b performs a logical NAND between the mode pulse signal Smp and the signal S11, and outputs a signal S13.

The AND circuit 83 receives input of the signal S12 of the NAND circuit 82a and the signal S13 of the NAND circuit 82b. The AND circuit 83 performs a logical AND between the signal S12 and the signal S13, and outputs the second control signal Spwm2.

The second control signal Spwm2 generated in this way is a signal for controlling the secondary switches in the output part 10A. In detail, the second control signal Spwm2 is input to the switch 11c, which is the high-side switch of the secondary switches via the level shifter 17b and the buffer circuit 14c shown in FIG. 25, as the above-mentioned drive signal Sgate3. The second control signal Spwm2 is also input to the switch 11d, which is the low-side switch of the secondary switches via the inverter circuit 18b and the buffer circuit 14d shown in FIG. 25, as the above-mentioned drive signal Sgate4.

The first delay time td1 is set based on the boost capacitor 12a shown in FIG. 25. For example, the resistance of the resistor 62 and the capacitance of the capacitor 63 are set based on the capacitance of the boost capacitor 12a and the like. Therefore, the first delay time td1 can be set to the same length as the time necessary for charging the boost capacitor 12a.

The second delay time td2 is set based on the boost capacitor 12b shown in FIG. 25. For example, the resistance of the resistor 92 and the capacitance of the capacitor 93 are set based on the capacitance of the boost capacitor 12b and the like. Therefore, the second delay time td2 can be set to the same length as the time necessary for charging the boost capacitor 12b.

The second delay time td2 is desirably set to the same length as the first delay time td1. In the case where it is difficult to set the second delay time td2 to the same length as the first delay time td1, the second delay time td2 is desirably set to be slightly longer than the first delay time td1.

FIGS. 28 to 31 are each a waveform diagram describing the operation of the output controller 70A in the second embodiment. In FIGS. 28 to 31, Vgs1 denotes the level of the voltage between the gate and source of the switch 11a shown in FIG. 25, Vg2 denotes the level of the gate voltage of the switch 11b shown in FIG. 25, Vgs3 denotes the level of the voltage between the gate and source of the switch 11c shown in FIG. 25, and Vg4 denotes the level of the gate voltage of the switch 11d shown in FIG. 25. The first control signal Spwm1 is generated based on the PWM signal Spwm, the first delayed signal Sd1, and the second delayed signal Sd2, and so has the same period as the period T of the clock signal Sclk, as is also the case with the other signals shown in FIGS. 28 to 31. The second control signal Spwm2 is generated based on the PWM signal Spwm, the mode pulse signal Smp, and the second delayed signal Sd2, and so also has the same period as the period T of the clock signal Sclk. Therefore, the switching frequency of the output part 10A can be made equal to the frequency of the clock signal Sclk.

Figure 28:
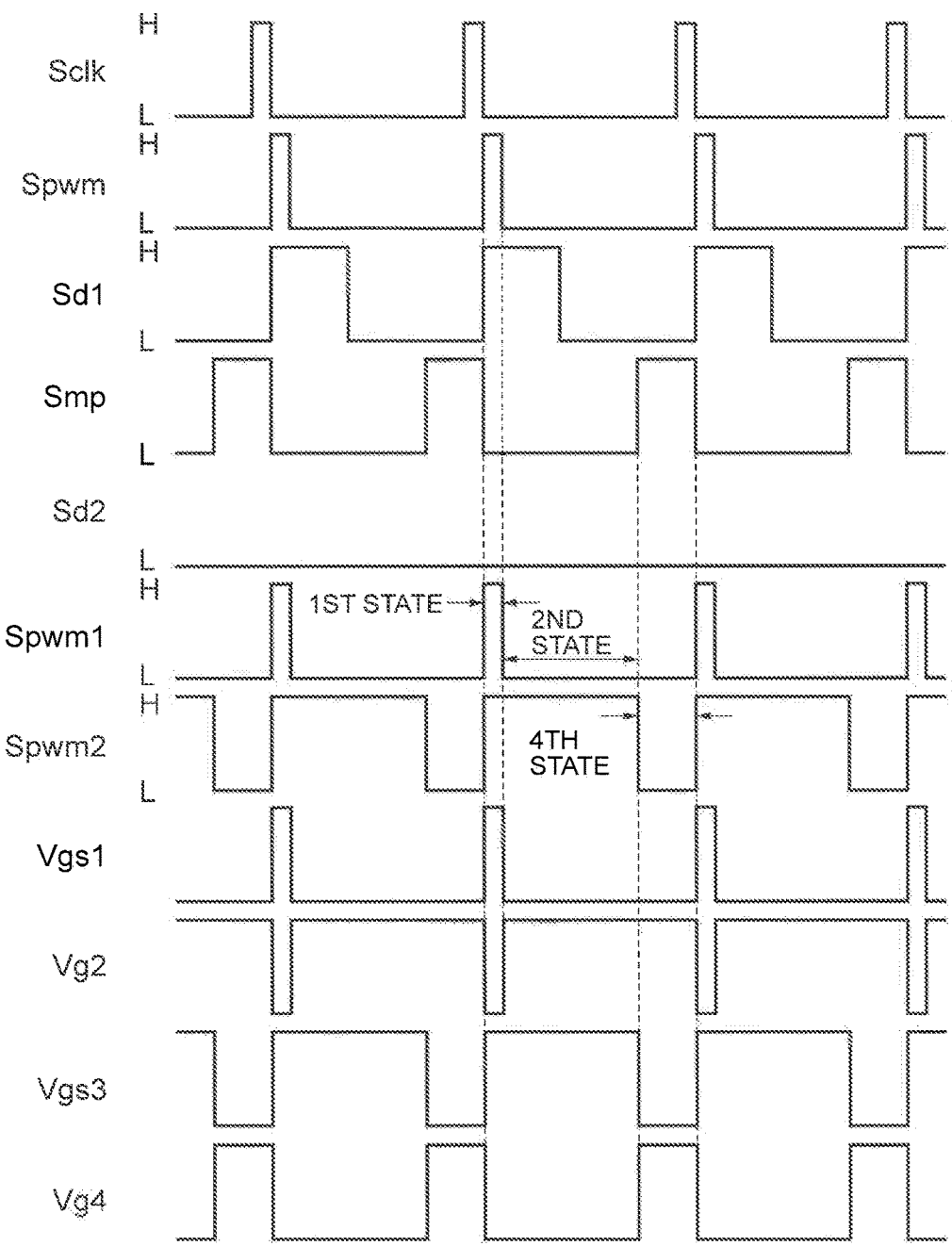
FIG. 28 is a waveform diagram describing the operation of the output controller, according to a second embodiment.
Figure 29:
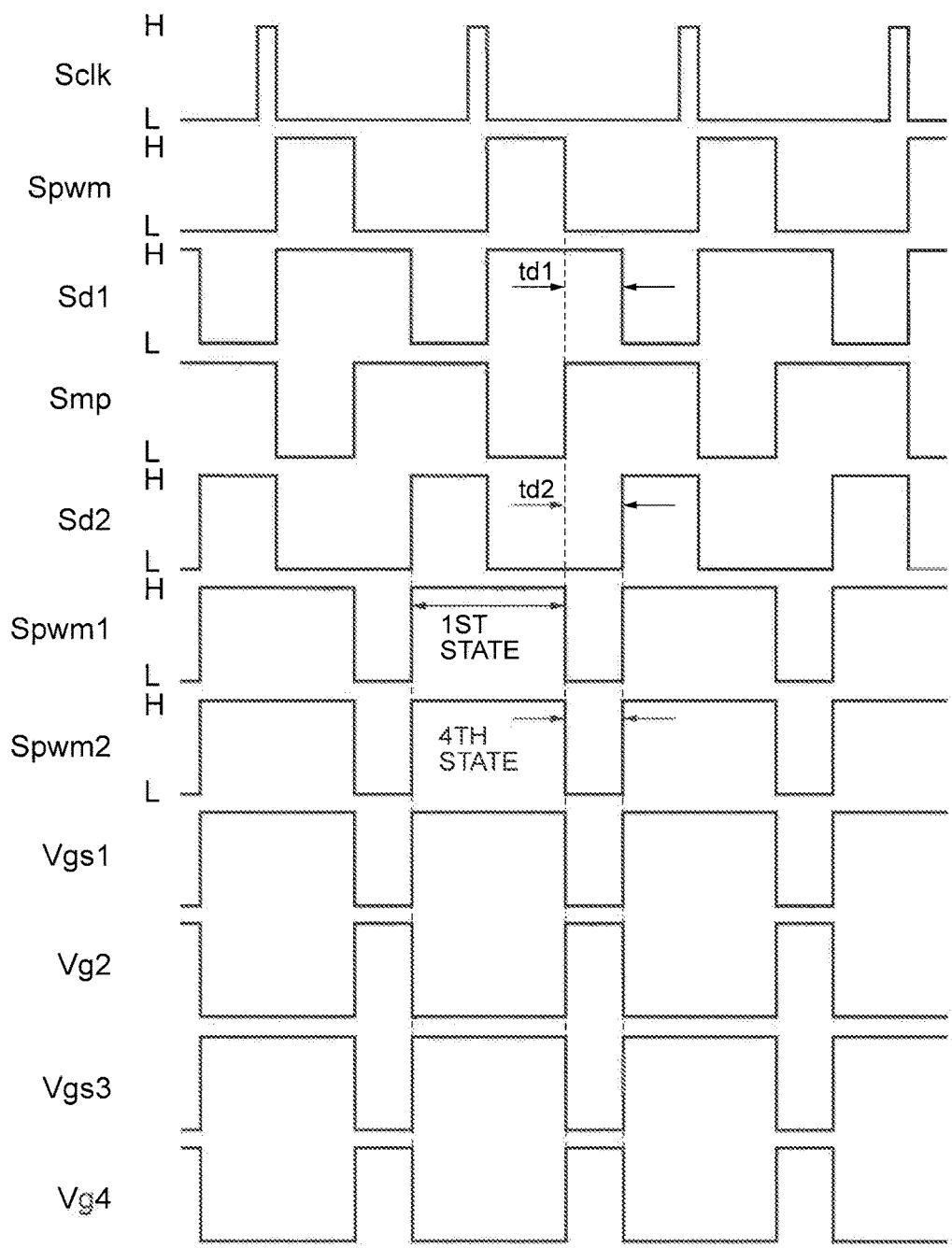
FIG. 29 is a waveform diagram describing the operation of the output controller, according to a second embodiment.

In the case where the input voltage Vin is higher than the output voltage Vout (Vin>Vout), the output controller 70A controls the switching of the output part 10A in the step-down mode. In detail, in the case where the difference between the input voltage Vin and the output voltage Vout is large, the output controller 70A outputs the first control signal Spwm1 and the second control signal Spwm2 so as to periodically repeat: the time period during which the first control signal Spwm1 is H level and the second control signal Spwm2 is H level, i.e. the time period of the first state; the time period during which the first control signal Spwm1 is L level and the second control signal Spwm2 is H level, i.e. the time period of the second state; and the time period during which the first control signal Spwm1 is L level and the second control signal Spwm2 is L level, i.e. the time period of the fourth state, as shown in FIG. 28. When the difference between the input voltage Vin and the output voltage Vout is smaller, the time period of the first state is longer. The time period of the second state is reduced to zero when the difference between the input voltage Vin and the output voltage Vout decreases to a predetermined value or less, as shown in FIG. 29. The output controller 70A outputs the first control signal Spwm1 and the second control signal Spwm2 so as to periodically repeat: the time period during which the first control signal Spwm1 is H level and the second control signal Spwm2 is H level, i.e. the time period of the first state; and the time period during which the first control signal Spwm1 is L level and the second control signal Spwm2 is L level, i.e. the time period of the fourth state.

When the input voltage Vin is approximately equal to the output voltage Vout, the time period of the fourth state is shortest, and equal to the first delay time td1 and the second delay time td2, as shown in FIG. 29.

Here, the first delay time td1 of the first delayed signal Sd1 overlaps the second delay time td2 of the second delayed signal Sd2. Therefore, setting the second delay time td2 longer than or equal to the first delay time td1 can cancel the blank time period tb shown in FIG. 13 which occurs in the PWM signal Spwm and affects the first control signal Spwm1 and the second control signal Spwm2.

Figure 30:
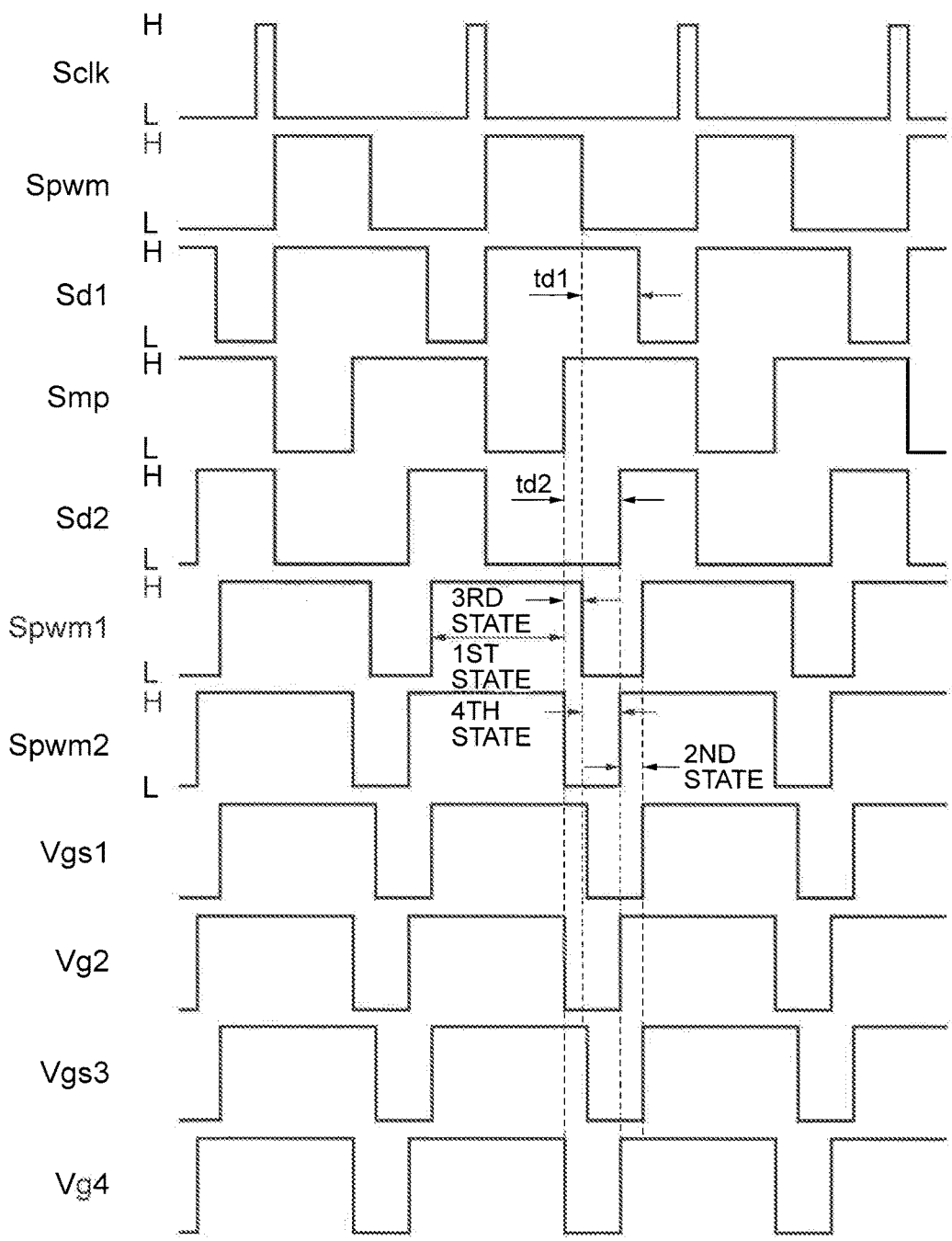
FIG. 30 is a waveform diagram describing the operation of the output controller, according to a second embodiment.
Figure 31:
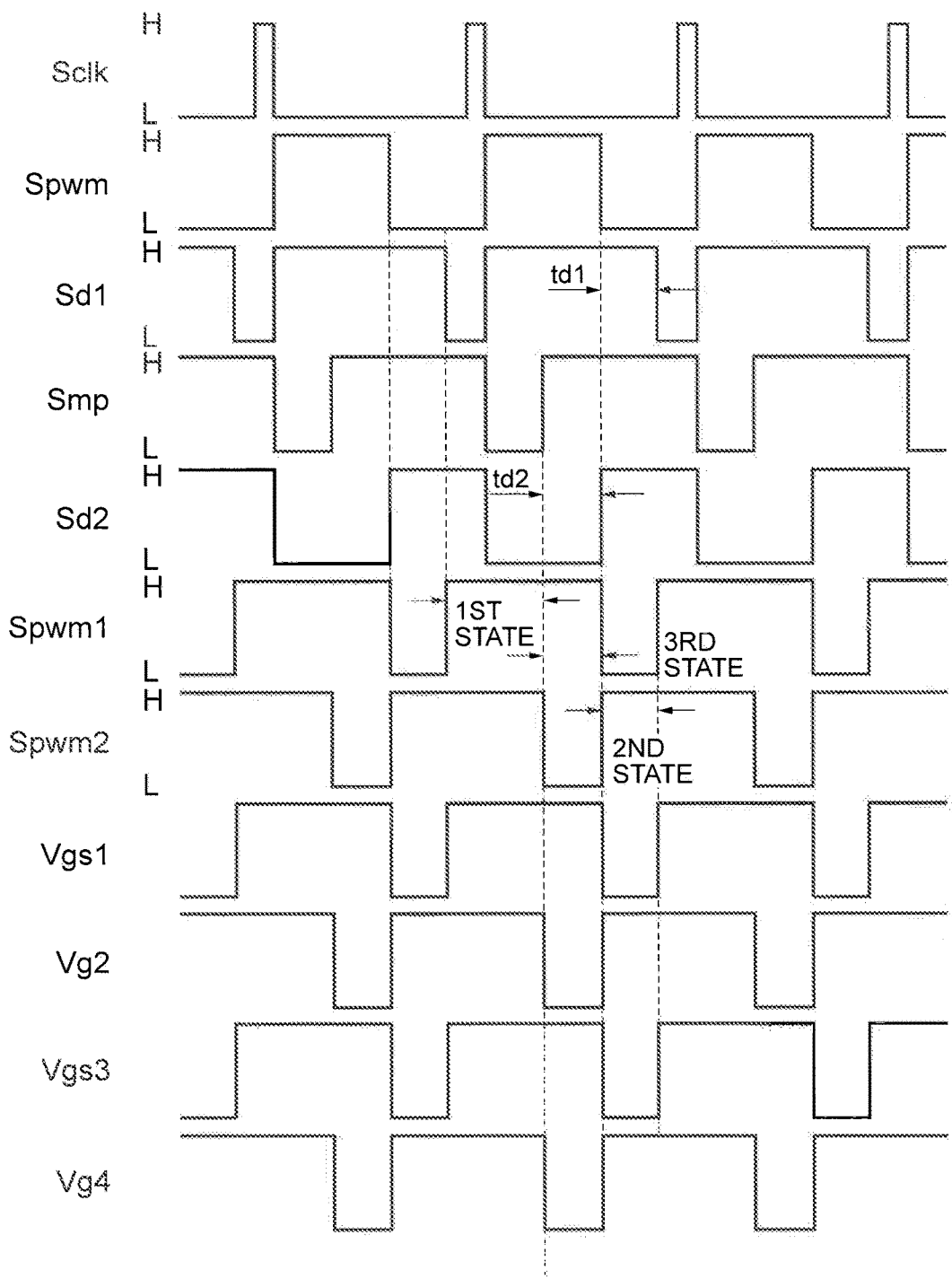
FIG. 31 is a waveform diagram describing the operation of the output controller, according to a second embodiment.

In the case where the input voltage Vin is lower than the output voltage Vout (Vin<Vout), the output controller 70A shown in FIG. 27 controls the switching of the output part 10A in the step-up mode. In detail, in the case where the difference between the output voltage Vout and the input voltage Vin is small, the output controller 70A outputs the first control signal Spwm1 and the second control signal Spwm2 so as to periodically repeat: the time period during which the first control signal Spwm1 is H level and the second control signal Spwm2 is H level, i.e. the time period of the first state; the time period during which the first control signal Spwm1 is H level and the second control signal Spwm2 is L level, i.e. the time period of the third state; the time period during which the first control signal Spwm1 is L level and the second control signal Spwm2 is L level, i.e. the time period of the fourth state; and the time period during which the first control signal Spwm1 is L level and the second control signal Spwm2 is H level, i.e. the time period of the second state, as shown in FIG. 30. When the difference between the output voltage Vout and the input voltage Vin is larger, the time period of the first state decreases to a predetermined value, and the time period of the third period is longer. Moreover, the time period of the fourth state is shorter, and the time period of the second state is longer. The time period of the fourth state is reduced to zero when the difference between the output voltage Vout and the input voltage Vin reaches a predetermined value or more, as shown in FIG. 31. Namely, the output controller 70A outputs the first control signal Spwm1 and the second control signal Spwm2 so as to periodically repeat: the time period during which the first control signal Spwm1 is H level and the second control signal Spwm2 is H level, i.e. the time period of the first state; the time period during which the first control signal Spwm1 is H level and the second control signal Spwm2 is L level, i.e. the time period of the third state; and the time period during which the first control signal Spwm1 is L level and the second control signal Spwm2 is H level, i.e. the time period of the second state.

The total time period of the third state and the fourth state is equal to the second delay time td2, and the total time period of the fourth state and the second state is equal to the first delay time td1, as shown in FIG. 30. The time period of the third state is equal to the second delay time td2, and the time period of the second state is equal to the first delay time td1, as shown in FIG. 31. Thus, in the step-down mode and the step-up mode, each of the time period of the second state, the time period of the fourth state, and the total time period of the second state and the fourth state is longer than or equal to the first delay time td1. Therefore, setting the first delay time td1 based on the boost capacitor 12a can ensure the charge time for the boost capacitor 12a in each cycle of the step-down mode and the step-up mode. Likewise, each of the time period of the third state, the time period of the fourth state, and the total time period of the third state and the fourth state is longer than or equal to the second delay time td2. Therefore, setting the second delay time td2 based on the boost capacitor 12b can ensure the charge time for the boost capacitor 12b in each cycle of the step-down mode and the step-up mode.

When switching from the step-down mode to the step-up mode, the output controller 70A creates the third state between the first state and the fourth state, and creates the second state between the fourth state and the first state, as shown in FIGS. 29 and 30. When switching from the step-up mode to the step-down mode, the output controller 70A removes the third state between the first state and the fourth state, and removes the second state between the fourth state and the first state. Therefore, the output part 10A can be seamlessly switched from the step-down mode to the step-up mode or from the step-up mode to the step-down mode.

Although this embodiment shows an example where the output controller 70A controls the switching of the output part 10A so that each of the time period of the second state, the time period of the fourth state, and the total time period of the second state and the fourth state is longer than or equal to the first delay time td1 and each of the time period of the third state, the time period of the fourth state, and the total time period of the third state and the fourth state is longer than or equal to the second delay time td2, this is not a limitation. The output controller 70A may control the switching of the output part 10A so that each of the time period of the second state, the time period of the fourth state, and the total time period of the second state and the fourth state is longer than or equal to the second delay time td2 and each of the time period of the third state, the time period of the fourth state, and the total time period of the third state and the fourth state is longer than or equal to the first delay time td1. In such a case, the first delay time td1 is desirably set to the same length as the second delay time td2. In the case where it is difficult to set the first delay time td1 to the same length as the second delay time td2, the first delay time td1 is desirably set to be slightly longer than the second delay time td2.

Thus, in the control apparatus 20, the switching power supply 100A, and the control method in this embodiment, the output controller 70A controls the switching of the output part 10A so that each of the time period of the second state, the time period of the fourth state, and the total time period of the second state and the fourth state is longer than or equal to one of the first delay time td1 and the second delay time td2. Therefore, setting the one of the first delay time td1 and the second delay time td2 based on the boost capacitor 12a can ensure the charge time for the boost capacitor 12a in each cycle of the step-down mode and the step-up mode. The output controller 70A also controls the switching of the output part 10A so that each of the time period of the third state, the time period of the fourth state, and the total time period of the third state and the fourth state is longer than or equal to the other one of the first delay time td1 and the second delay time td2. Therefore, setting the other one of the first delay time td1 and the second delay time td2 based on the boost capacitor 12b can ensure the charge time for the boost capacitor 12b in each cycle of the step-down mode and the step-up mode. Accordingly, this enables control of the output part 10A comprising four switches which are N-type transistors, without changing the switching frequency.

The structures in the embodiments described above may be combined with each other, and part of the components in the embodiments may be replaced with each other. The structure of the present disclosure is not limited to the embodiments described above, and various changes may be made without departing from the subject matter of the present disclosure.

What is claimed is:

1. A control apparatus for a buck-boost power supply, comprising:
    an output part comprising:
        two primary switches that are each an N-type transistor;
        a first capacitor for driving a high-side switch of the two primary switches; and
        two secondary switches that are each a transistor;
    a pulse-width modulation (PWM) signal generator configured to generate a PWM signal having a pulse which has a pulse width based on an output voltage;
    a mode pulse signal generator configured to generate a mode pulse signal having a signal which has a time period based on at least one of an input voltage, a difference between the input voltage and the output voltage, and a difference between the input voltage and a voltage proportional to the output voltage;
    a first delayed signal generator configured to generate a first delayed signal having a pulse which has a rising edge or falling edge which is delayed for a first delay time from a rising edge or a falling edge of the pulse of the PWM signal, wherein the first delay time is equal to or longer than a time required to charge the first capacitor; and
    an output controller configured to control the output part, based on the PWM signal, the mode pulse signal and the first delayed signal, wherein the output controller controls switching of the output part so that a first time period during which the high-side switch of the two primary switches is off and a low-side switch of the two primary switches is on is longer than or equal to the first delay time.

2. The control apparatus according to claim 1, further comprising a second delayed signal generator configured to generate a second delayed signal having a pulse which has a rising edge or falling edge which is delayed for a second delay time from a rising edge or a falling edge of a pulse of the mode pulse signal, wherein the output controller is configured to control the output part, based on the PWM signal, the mode pulse signal, the first delayed signal and the second delayed signal.

3. The control apparatus according to claim 2, wherein the output controller controls switching of the output part so that the first time period is longer than or equal to the first delay time or the second delay time.

4. The control apparatus according to claim 2, wherein the two secondary switches are each an N-type transistor, and the output part further comprises a second capacitor for driving a high-side switch of the two secondary switches,
wherein the output controller controls the switching of the output part so that the first time period is longer than or equal to one of the first delay time and the second delay time, and
wherein the output controller controls the switching of the output part so that a second time period during which the high-side switch of the two secondary switches is off and a low-side switch of the two secondary switches is on is longer than or equal to the other one of the first delay time and the second delay time.

5. The control apparatus according to claim 1, wherein the signal of the mode pulse signal is a high level signal or a low level signal.

6. A buck-boost power supply, comprising:
an output part comprising:
two primary switches that are each an N-type transistor;
a first capacitor for driving a high-side switch of the two primary switches; and
two secondary switches that are each a transistor; and
a control apparatus comprising:
a PWM signal generator which generates a PWM signal having a PWM signal pulse;
a mode pulse signal generator which generates a mode pulse signal having a mode pulse signal pulse;
a first delayed signal generator which generates a first delayed signal having a first delayed signal pulse, wherein the first delayed signal pulse has a pulse width that exceeds a pulse width of the PWM signal pulse by a first delay period, wherein the first delay period is equal to or longer than a time required to charge the first capacitor; and
an output controller, wherein the output controller is configured to control the output part based on the PWM signal, the mode pulse signal, and the first delayed signal.

7. The buck-boost power supply according to claim 6, further comprising a second delayed signal generator which generates a second delayed signal having a second delayed signal pulse, wherein the second delayed signal pulse has a pulse width that is shorter than a pulse width of the mode pulse signal by a second delay time.

8. The buck-boost power supply according to claim 7, wherein the output controller is configured to control the output part based on the PWM signal, the mode pulse signal, the first delayed signal, and the second delayed signal.

9. The buck-boost power supply according to claim 8, wherein the second delay time is equal to or longer than the first delay time.

10. The buck-boost power supply according to claim 8, wherein the two secondary switches are each an N-type transistor, and the output part further comprises a second capacitor for driving a high-side switch of the two secondary switches, and wherein the second delay time is equal to or longer than a time required to charge the second capacitor.

11. A control method for a buck-boost power supply, comprising:
generating a PWM signal having a pulse which has a pulse width based on an output voltage;
generating a mode pulse signal having a pulse and having a signal which has a time period based on at least one of an input voltage, a difference between the input voltage and the output voltage, and a difference between the input voltage and a voltage proportional to the output voltage;
generating a first delayed signal having a pulse which has a rising edge or falling edge delayed for a first delay time from a rising edge or a falling edge of the pulse of the PWM signal; and
controlling an output part of the buck-boost power supply, based on the PWM signal, the mode pulse signal and the first delayed signal, the output part comprising: two primary switches that are each an N-type transistor; a first capacitor for driving a high-side switch of the two primary switches; and two secondary switches that are each a transistor,
wherein the controlling comprises controlling switching of the output part so that a first time period during which the high-side switch of the two primary switches is off and a low-side switch of the two primary switches is on is longer than or equal to the first delay time, wherein the first delay time is longer than or equal to a time required to charge the first capacitor.

12. The control method according to claim 11, further comprising generating a second delayed signal having a pulse which has a pulse width that is shorter than a pulse width of the mode pulse signal by a second delay time.

13. The control method according to claim 12, further comprising controlling the output part of the buck-boost power supply, based on the PWM signal, the mode pulse signal, the first delayed signal, and the second delayed signal.

14. The control method according to claim 12, wherein the second delay time is equal to or longer than the first delay time.

15. The control method according to claim 12, wherein the two secondary switches are each an N-type transistor, and the output part further comprises a second capacitor for driving a high-side switch of the two secondary switches, and wherein the second delay time is equal to or longer than a time required to charge the second capacitor.

* * * * *